I

United States Patent
Han et al.

(10) Patent No.: US 10,593,596 B2
(45) Date of Patent: Mar. 17, 2020

(54) SEMICONDUCTOR DEVICE, METHOD OF FABRICATING THE SAME, AND PATTERNING METHOD

(71) Applicant: SAMSUNG ELECTRONICS CO., LTD., Suwon-si, Gyeonggi-Do (KR)

(72) Inventors: Dongwoo Han, Seoul (KR); Kwang-Yong Yang, Seoul (KR); Jinwook Lee, Seoul (KR); Kyungyub Jeon, Yongin-si (KR); Haegeon Jung, Yongin-si (KR); Dohyoung Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/959,319

(22) Filed: Apr. 23, 2018

(65) Prior Publication Data
US 2018/0240710 A1  Aug. 23, 2018

Related U.S. Application Data

(63) Continuation of application No. 15/260,952, filed on Sep. 9, 2016, now Pat. No. 9,984,931.

(30) Foreign Application Priority Data

Sep. 23, 2015 (KR) .................... 10-2015-0134699

(51) Int. Cl.
*H01L 21/336* (2006.01)
*H01L 21/8234* (2006.01)
(Continued)

(52) U.S. Cl.
CPC ........... *H01L 21/823431* (2013.01); *H01L 21/30604* (2013.01); *H01L 21/823437* (2013.01);
(Continued)

(58) Field of Classification Search
CPC ....... H01L 21/823431; H01L 21/30604; H01L 21/823437; H01L 27/0886; H01L 29/6656; H01L 29/66795
See application file for complete search history.

(56) References Cited

U.S. PATENT DOCUMENTS 6,127,278 A  10/2000  Wang et al.
6,486,070 B1  11/2002  Ho et al.
(Continued)

FOREIGN PATENT DOCUMENTS

JP  2001526462 A  12/2001
JP  2002110647 A   4/2002
(Continued)

*Primary Examiner* — Victor A Mandala
*Assistant Examiner* — Colleen E Snow
(74) *Attorney, Agent, or Firm* — Volentine, Whitt & Francos, PLLC

(57) ABSTRACT

A method of fabricating a semiconductor device includes forming first and second active patterns on first and second regions, respectively, of a substrate, forming first and second gate structures on the first and second active patterns, respectively, forming a coating layer to cover the first and second gate structures and the first and second active patterns, and forming a first recess region in the first active pattern between the first gate structures and a second recess region in the second active pattern between the second gate structures.

18 Claims, 26 Drawing Sheets

(51) Int. Cl.
   *H01L 29/66*     (2006.01)
   *H01L 27/088*    (2006.01)
   *H01L 21/306*    (2006.01)

(52) U.S. Cl.
   CPC ...... *H01L 27/0886* (2013.01); *H01L 29/6656* (2013.01); *H01L 29/66795* (2013.01)

(56) References Cited

U.S. PATENT DOCUMENTS

| | | |
|---|---|---|
| 6,506,674 B2 | 1/2003 | Ikeda et al. |
| 6,703,170 B1 | 3/2004 | Pindo |
| 7,303,999 B1 | 12/2007 | Sriraman et al. |
| 7,842,582 B2 | 11/2010 | Kim |
| 8,299,564 B1 | 10/2012 | Wu et al. |
| 8,580,658 B1 | 11/2013 | Davis |
| 8,900,937 B2 | 12/2014 | Lin et al. |
| 8,921,233 B2 | 12/2014 | Sim et al. |
| 9,006,110 B1 * | 4/2015 | Sun ............... H01L 21/30604 257/368 |
| 2005/0127348 A1 | 6/2005 | Horak et al. |
| 2012/0149200 A1 | 6/2012 | Culp et al. |
| 2012/0149203 A1 | 6/2012 | Fu et al. |

FOREIGN PATENT DOCUMENTS

| | | |
|---|---|---|
| KR | 100351652 | 8/2002 |
| KR | 101002447 | 12/2010 |

* cited by examiner

SEMICONDUCTOR DEVICE, METHOD OF FABRICATING THE SAME, AND PATTERNING METHOD

PRIORITY STATEMENT

This is a Continuation of U.S. application Ser. No. 15/260,952, filed Sep. 9, 2016, which issued as U.S. Pat. No. 9,984,931 on May 29, 2018, and which claims priority under 35 U.S.C. § 119 to Korean Patent Application No. 10-2015-0134699, filed on Sep. 23, 2015, in the Korean Intellectual Property Office, the entire contents of which are hereby incorporated by reference.

BACKGROUND

The inventive concept relates to semiconductor devices, and in particular, to semiconductor devices having different series of patterns and the forming of recesses in regions where the different series of patterns are provided. For example, the inventive concept relates to semiconductor devices having metal-oxide-semiconductor field-effect transistors (MOS-FETs) and the forming of recesses in which source/drains of the MOS-FETs are epitaxially grown.

A semiconductor device may include integrated circuits (ICs) including metal-oxide-semiconductor field-effect transistors (MOS-FETs). As the size and design rule of such semiconductor devices decrease, the MOS-FETs are being increasingly scaled down. The reduction in size of the MOS-FET may lead to deterioration in operational properties of the semiconductor device. A variety of studies are being conducted to overcome technical limitations associated with the scaling-down of semiconductor devices and to realize high performance semiconductor devices.

SUMMARY

According to the inventive concept, there is provided a method of fabricating a semiconductor device including providing a substrate having a first region and a second region, forming first and second active patterns at the first and second regions, respectively, of the substrate, forming first gate structures across the first active pattern as spaced apart from each other by a first distance along the first active pattern, forming second gate structures across the second active pattern as spaced apart from each other by a second distance along the second active pattern, forming a coating layer to cover the first and second gate structures and the first and second active patterns, performing a recess process to form a first recess in the first active pattern between the first gate structures and a second recess in the second active pattern between the second gate structures, and forming a source/drain epitaxial layer in the first and second recesses. The coating layer is formed to a first thickness on a region of the first active pattern between the first gate structures and to have a second thickness different from the first thickness on a region of the second active pattern between the second gate structures.

According to the inventive concept, there is also provided a semiconductor device including a substrate with a first region and a second region, a first active pattern provided on the first region of the substrate, a second active pattern provided on the second region of the substrate, first gate structures spaced apart from each other by a first distance to cross the first active pattern, second gate structures spaced apart from each other by a second distance to cross the second active pattern, a first source/drain region provided on the first active pattern between the first gate structures, and a second source/drain region provided on the second active pattern between the second gate structures. Each of the first gate structures may include a first gate pattern and a first gate spacer on an outer side surface of the first gate pattern, the first gate spacer including a first protrusion protruding from a lower portion of the first gate spacer by a first length in a direction parallel to the first active pattern, each of the second gate structures may include a second gate pattern and a second gate spacer on an outer side surface of the second gate pattern, the second gate spacer including a second protrusion protruding from a lower portion of the second gate spacer by a second length in a direction parallel to the second active pattern, and the first length may be different from the second length.

According to the inventive concept, there is also provided a patterning method including forming first and second patterns on first and second regions, respectively, of a substrate and in which the first and second patterns have first and second aspect ratios different from each other, and the first and second patterns are formed by forming a coating layer to first and second thicknesses on the first and second regions, respectively, and performing a recessing process to form first and second recesses to substantially the same depths in the first and second regions, respectively.

According to the inventive concept, there is also provided a semiconductor device including an active pattern on a substrate, a gate electrode provided to cross the active pattern, gate spacers provided on side surfaces of the gate electrode, and source/drain regions provided on the active pattern at both sides of the gate electrode. The gate spacer may include a first portion in contact with the side surfaces of the gate electrode, and a second portion protruding from a lower portion of the first portion in a direction parallel to the active pattern.

According to the inventive concept, there is also provided a method of manufacturing a semiconductor device having first and second regions disposed beside one another so as to not overlap, and which includes forming a series of first features as spaced from each other along a first direction in the first region of the device at an upper surface of a substrate and forming a series of second features as spaced from each other along a second direction in the second region of the device at the upper surface of the substrate and such that the spacing between adjacent ones of the first features in the first direction is greater than the spacing between adjacent ones of the second features in the second direction, subsequently forming a coating on the upper surface of the substrate and which covers the first and second regions of the device and in which the thickness of the coating in the first region of the device at a location between the adjacent ones of the first features is greater than the thickness of the coating in the second region of the device at a locations between the adjacent ones of the second features, and performing an etching process that etches through the coating at respective locations in the first and second regions of the device and forms a first recess in the substrate in the first region of the device and a second recess in the substrate in the second region of the device.

BRIEF DESCRIPTION OF THE DRAWINGS

The inventive concept will be more clearly understood from the following detailed description of examples thereof taken in conjunction with the accompanying drawings. The accompanying drawings represent non-limiting examples as described hereinafter.

Figure 1A:
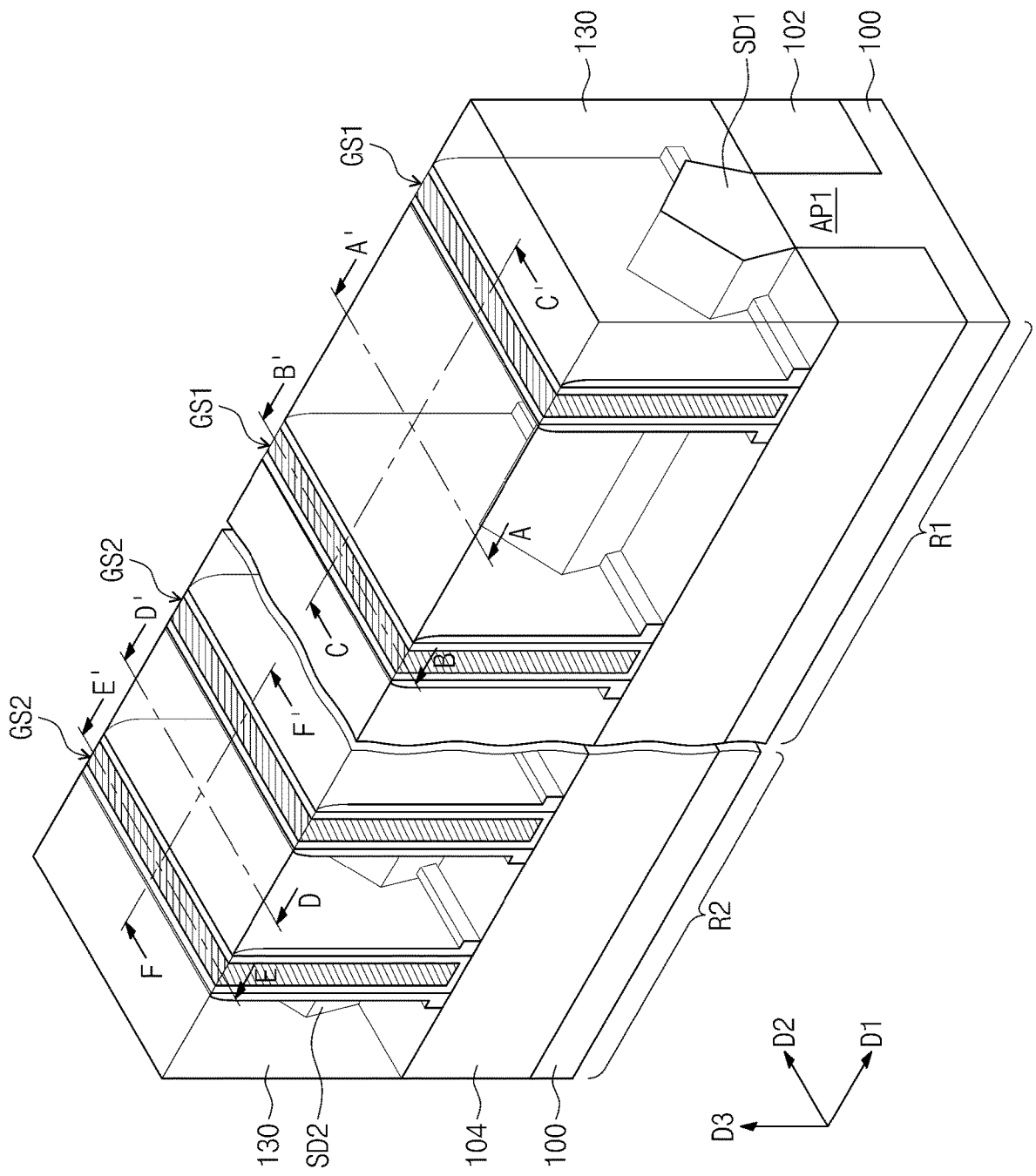
FIG. 1A is a perspective view illustrating a semiconductor device according to some examples of the inventive concept.

It should be noted that these figures are intended to illustrate the general characteristics of methods, structure and/or materials utilized in certain examples and to supplement the written description provided below. These drawings are not, however, to scale and may not precisely reflect the precise structural or performance characteristics of any given example, and should not be interpreted as defining or limiting the range of values or properties encompassed by examples. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which examples of the inventive concepts are shown. The inventive concepts and methods of achieving them will be apparent from the following examples that will be described in more detail with reference to the accompanying drawings. The inventive concept may, however, be exemplified in different forms and should not be construed as limited to the examples set forth herein. Rather, these examples are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the sectional views may be idealized views. Accordingly, shapes shown in the sectional views may differ from the actual shapes according to manufacturing techniques and/or allowable errors. Therefore, the inventive concepts are not limited to the specific shape illustrated in the exemplary views, but may include other shapes that may be created according to manufacturing processes.

Other terminology used herein for the purpose of describing particular examples of the inventive concept is to be taken in context. For example, the terms "comprises" or "comprising" when used in this specification specifies the presence of stated features or processes but does not preclude the presence or additional features or processes. The term "substrate" as used alone will be understood as referring basically to any underlying structure of one or more layers. The term "extending" will generally refer to the longest dimension of a particular feature, especially the lengthwise dimension or longitudinal direction in the case of a linear feature. The term "pattern" may refer to one feature in a series of similar features that have been formed by some patterning process. The term "about" as used with reference to parameters or conditions of a process will be understood as meaning equal to but is used encompass slight variations inherent in the particular process being described. The term "spacing" between features may be used synonymously with the term pitch and will generally refer to the average spacing between regularly spaced apart features in a linear array of the features.

Examples of aspects of the present inventive concepts explained and illustrated herein include their complementary counterparts. The same reference numerals or the same reference designators denote the same elements throughout the drawings.

Figure 1B:
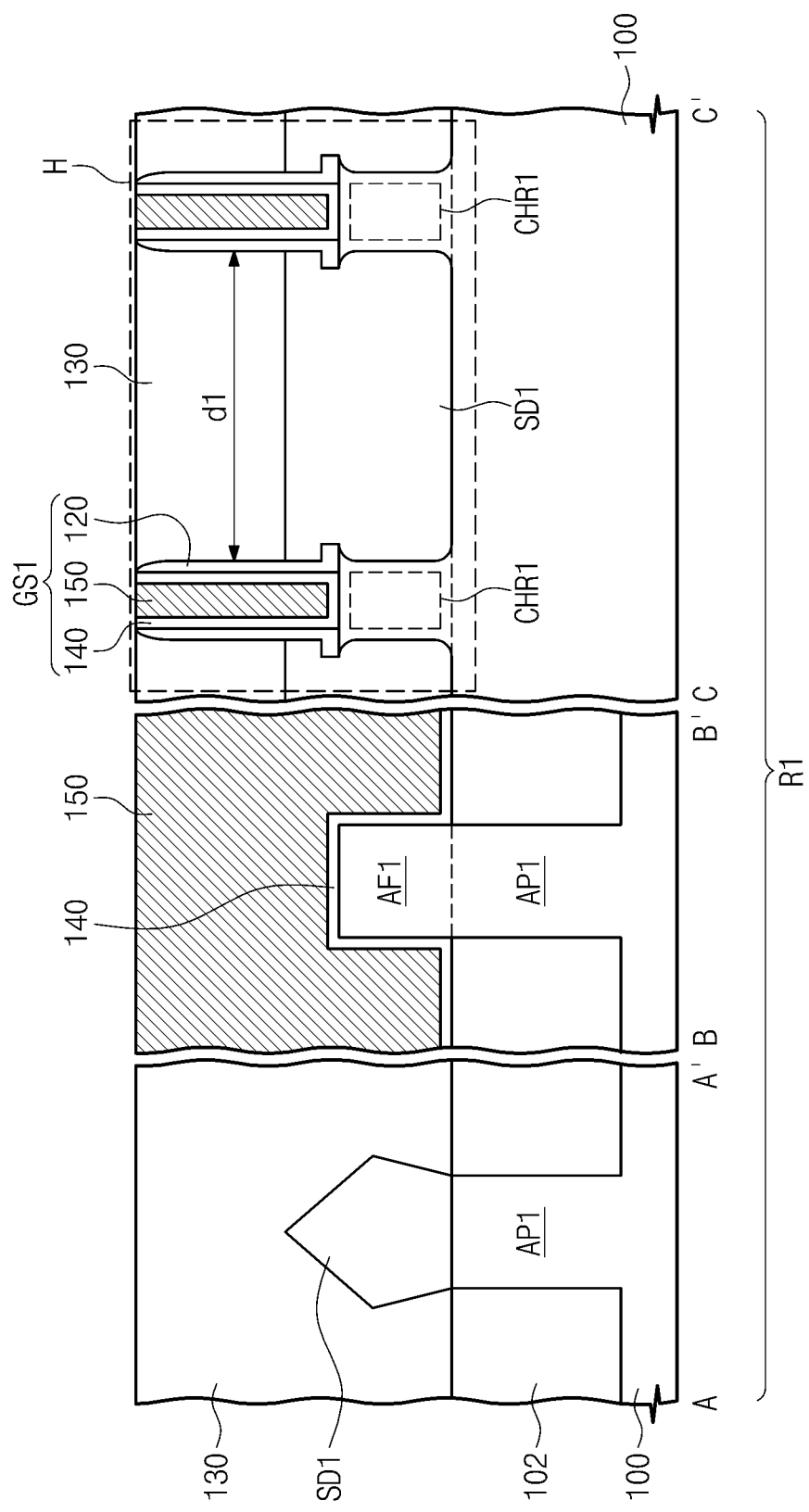
FIG. 1B is a sectional view illustrating sections taken along lines A-A', B-B', and C-C' of FIG. 1A.
Figure 1C:
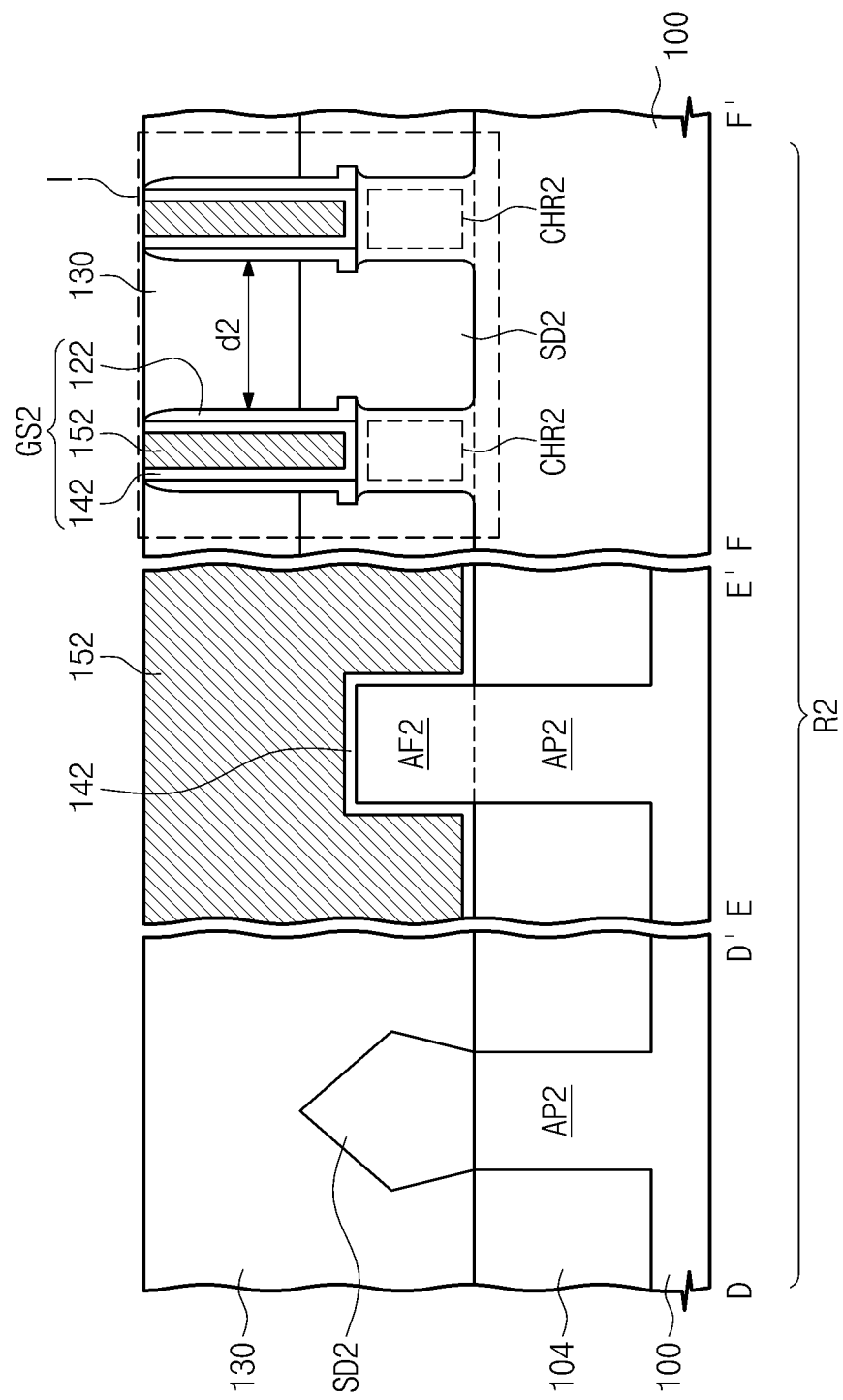
FIG. 1C is a sectional view illustrating sections taken along lines D-D', E-E', and F-F' of FIG. 1A.
Figure 2A:
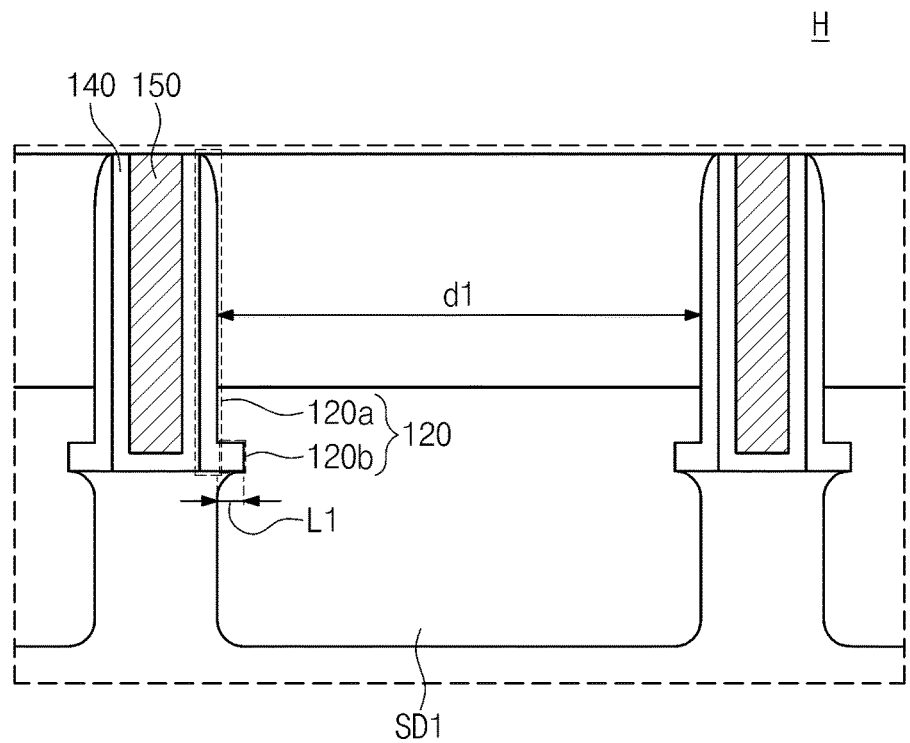
FIG. 2A is an enlarged view of a portion 'H' of FIG. 1B.
Figure 2B:
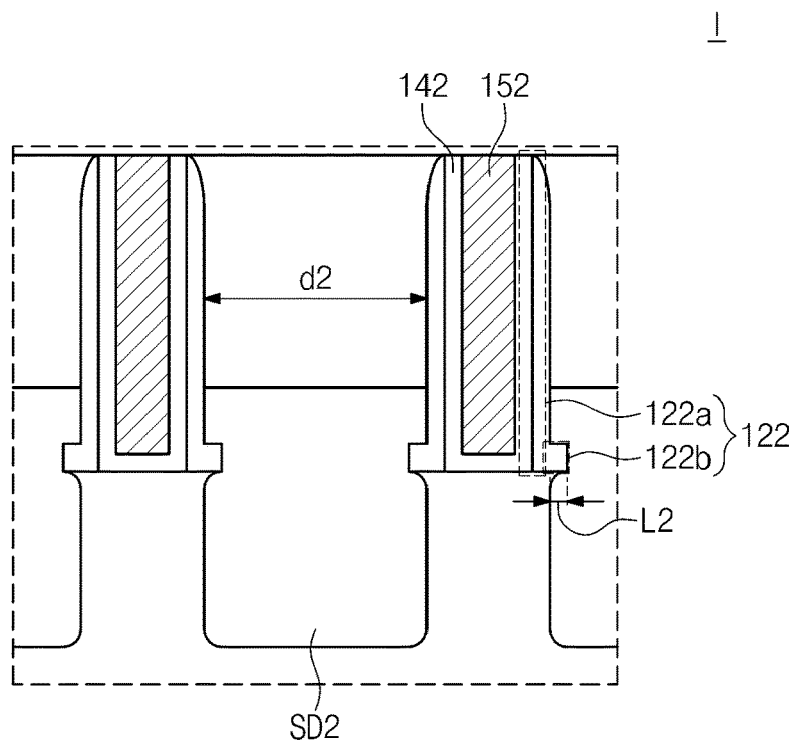
FIG. 2B is an enlarged view of a portion 'I' of FIG. 1C.

FIG. 1A is a perspective view illustrating a semiconductor device according to some examples of the inventive concept. FIG. 1B is a sectional view illustrating sections taken along lines A-A', B-B', and C-C' of FIG. 1A, and FIG. 1C is a sectional view illustrating sections taken along lines D-D', E-E', and F-F' of FIG. 1A. FIG. 2A is an enlarged view of a portion 'H' of FIG. 1B, and FIG. 2B is an enlarged view of a portion 'I' of FIG. 1C.

Referring to FIGS. 1A to 1C, active patterns and gate structures crossing the active patterns may be provided on a substrate 100. The substrate 100 may be a semiconductor substrate. As an example, the substrate 100 may be a bulk silicon wafer or a silicon-on-insulator (SOI) wafer.

The substrate 100 (or device in general) may include a first region R1 and a second region R2. The active patterns may include a first active pattern AP1 on the first region R1 and a second active pattern AP2 on the second region R2. The gate structures may include a first gate structure GS1 crossing the first active pattern AP1 and a second gate structure GS2 crossing the second active pattern AP2.

When viewed in plan, each of the first and second active patterns AP1 and AP2 may be a line-shaped structure extending in a direction. The extension directions of the first and second active patterns AP1 and AP2 may be the same or different from each other. Hereinafter, for the sake of simplicity, the description that follows will refer to an example in which each of the first and second active patterns AP1 and AP2 extends in a first direction D1.

Each of the first and second active patterns AP1 and AP2 may be provided to have a longitudinal axis parallel to the first direction D1 and a transverse axis parallel to a second direction D2 crossing the first direction D1. Each of the first and second active patterns AP1 and AP2 may be provided to have a structure upwardly protruding from the substrate 100. For example, each of the first and second active patterns AP1 and AP2 may protrude in a third direction D3 that is orthogonal to both of the first and second directions D1 and D2.

First device isolation patterns 102 may be provided at both sides of the first active pattern AP1, and second device isolation patterns 104 may be provided at both sides of the second active pattern AP2. The first and second device isolation patterns 102 and 104 may be formed of or include oxide, nitride, and/or oxynitride. Each of the first and second device isolation patterns 102 and 104 may be a line-shaped structure extending in the first direction D1. The first device isolation patterns 102 may be spaced apart from each other with the first active pattern AP1 interposed therebetween in the second direction D2, and the second device isolation patterns 104 may be spaced apart from each other with the second active pattern AP2 interposed therebetween in the second direction D2.

Each of the first device isolation patterns 102 may be provided to partially cover a side surface of the first active pattern AP1. For example, the first device isolation patterns 102 may be provided to expose an upper portion of the first active pattern AP1. The upper portion of the first active pattern AP1 exposed by the first device isolation patterns 102 will be referred to as a first active fin AF1. Each of the second device isolation patterns 104 may be provided to partially cover a side surface of the second active pattern AP2. For example, the second device isolation patterns 104 may be provided to expose an upper portion of the second active pattern AP2. The upper portion of the second active pattern AP2 exposed by the second device isolation patterns 104 will be referred to as a second active fin AF2.

In some examples, a plurality of the first gate structures GS1 may be provided to cross the first active pattern AP1. A plurality of the second gate structures GS2 may be provided to cross the second active pattern AP2. Each of the first gate structures GS1 may extend in the second direction D2 and may be spaced apart from each other in the first direction D1. Similarly, each of the second gate structures GS2 may extend in the second direction D2 and may be spaced apart from each other in the first direction D1. A first distance d1 between adjacent ones of the first gate structures GS1 may be greater than a second distance d2 between adjacent ones of the second gate structures GS2.

The first gate structure GS1 may cross the first active pattern AP1 and may cover a top surface and both side surfaces of the first active fin AF1. The first active fin AF1 may be locally provided below the first gate structure GS1. The first active fin AF1 may include a first channel region CHR1. The second gate structure GS2 may cross the second active pattern AP2 and may cover a top surface and both side surfaces of the second active fin AF2. The second active fin AF2 may be locally provided below the second gate structure GS2. The second active fin AF2 may include a second channel region CHR2.

Referring to FIGS. 1A, 1B, and 2A, the first gate structure GS1 may include a first gate electrode 150 crossing the first active pattern AP1, a first gate spacer 120 on both side surfaces of the first gate electrode 150, and a first gate dielectric pattern 140 between the first gate electrode 150 and the first gate spacer 120.

The first gate spacer 120 may include a first portion 120a and a first protrusion 120b. The first portion 120a of the first gate spacer 120 may be in contact with an outer side surface of the first gate electrode 150 and may extend parallel to the first gate electrode 150. The first protrusion 120b may be positioned at a lower portion of the first gate spacer 120 and may extend from the first portion 120a in a direction away from the first gate structure GS1. For example, the first protrusion 120b may protrude outward from the first gate electrode 150. As an example, the first protrusion 120b may extend in the first direction D1. The first protrusion 120b may protrude from the first portion 120a by a first length L1. In some examples, the portion of the first gate spacer 120 where the first protrusion 120b meets the first portion 120a may be concave, i.e., the outer surface of the first gate spacer 120 where the first protrusion 120b meets the first portion 120a may be rounded. In certain examples, a portion of the first active pattern AP1 positioned below the first protrusion 120b may be recessed in a direction toward the first gate electrode 150. In this example, the portion of the first active pattern AP1 positioned below the first protrusion 120b may be concave, i.e., the outer surface where the portion of the first active pattern AP1 meets the first protrusion 120b may be rounded.

The first gate dielectric pattern 140 may include a portion interposed between the first gate electrode 150 and the first active fin AF1. Furthermore, the first gate dielectric pattern 140 may extend horizontally to partially cover top surfaces of the first device isolation patterns 102. The first gate dielectric pattern 140 may extend along a bottom surface of the first gate electrode 150.

Referring to FIGS. 1A, 1C, and 2B, the second gate structure GS2 may include a second gate electrode 152 crossing the second active pattern AP2, a second gate spacer 122 on both side surfaces of the second gate electrode 152, and a second gate dielectric pattern 142 between the second gate electrode 152 and the second gate spacer 122.

The second gate spacer 122 may include a second portion 122a and a second protrusion 122b. The second portion 122a of the second gate spacer 122 may be in contact with an outer side surface of the second gate electrode 152 and may extend parallel to the second gate electrode 152. The second protrusion 122b may be positioned at a lower portion of the second gate spacer 122 and may extend from the second portion 122a in a direction away from the second gate structure GS2. The second protrusion 122b may protrude outward from the second gate electrode 152. As an example, the second protrusion 122b may extend in the first direction D1. The second protrusion 122b may protrude from the second portion 122a by a second length L2. Here, the second length L2 may be shorter than the first length L1. For example, the second length L2 may be shorter by about 5 Å to about 2 nm than the first length L1. In some examples, a portion of the second gate spacer 122 where the second protrusion 122b meets the second portion 122a may be concave, i.e., the outer surface of the second gate spacer 122 where the second protrusion 122b meets the second portion 122a may be rounded. In certain examples, a portion of the second active pattern AP2 positioned below the second protrusion 122b may be recessed in a direction toward the second gate electrode 152. In this example, the portion of the second active pattern AP2 positioned below the second protrusion 122b where the second active pattern AP2 meets second protrusion 122b may be concave, i.e., the outer surface of the second active pattern AP2 where the second active pattern AP2 meets second protrusion 122b may be rounded.

The second gate dielectric pattern 142 may include a portion interposed between the second gate electrode 152 and the second active fin AF2. Furthermore, the second gate dielectric pattern 142 may extend horizontally to partially cover top surfaces of the second device isolation patterns 104. The second gate dielectric pattern 142 may extend along a bottom surface of the second gate electrode 152.

First source/drain regions SD1 may be provided on the first active pattern AP1 and at both sides, respectively, of the first gate structure GS1. The first source/drain regions SD1 may be epitaxial patterns that are epitaxially grown from the first active pattern AP1. The first source/drain regions SD1 may be formed of or include at least one of silicon germanium (SiGe), silicon (Si), and silicon carbide (SiC).

Second source/drain regions SD2 may be provided on the second active pattern AP2 and at both sides, respectively, of the second gate structure GS2. The second source/drain regions SD2 may be epitaxial patterns that are epitaxially grown from the second active pattern AP2. The second source/drain regions SD2 may be formed of or include at least one of silicon germanium (SiGe), silicon (Si), and silicon carbide (SiC).

The first and second gate electrodes 150 and 152 may be formed of or include at least one material selected from the group consisting of conductive metal nitrides (e.g., titanium nitride or tantalum nitride) and metals (e.g., aluminum or tungsten). The first and second gate spacers 120 and 122 may be formed of or include a nitride (e.g., silicon nitride). The first and second gate dielectric patterns 140 and 142 may include a high-k dielectric material. For example, the first and second gate dielectric patterns 140 and 142 may be formed of or include at least one of hafnium oxide, hafnium silicate, zirconium oxide, and zirconium silicate, but the inventive concept may not be limited thereto.

A lower interlayer insulating layer 130 may be provided on the substrate 100 to cover the first and second gate structures GS1 and GS2 and the first and second source/drain regions SD1 and SD2. The lower interlayer insulating layer 130 may have a top surface coplanar with those of the first and second gate structures GS1 and GS2 and may be formed of or include at least one of silicon oxide, silicon nitride, silicon oxynitride, and low-k dielectric materials.

Although not shown, an upper interlayer insulating layer may be further provided on the substrate 100 provided with the first and second gate structures GS1 and GS2. The upper interlayer insulating layer may be formed of or include at least one of, for example, oxides, nitrides, and oxynitrides. First and second contact holes may be formed to penetrate the upper interlayer insulating layer and the lower interlayer insulating layer 130. The first contact holes may be provided to expose the first source/drain regions SD1, and the second contact holes may be provided to expose the second source/drain regions SD2. Contact plugs may be provided in the first and second contact holes, respectively. Interconnection lines may be provided on the upper interlayer insulating layer. The interconnection lines may be connected to at least one of the contact plugs. In some examples, each of the first and second source/drain regions SD1 and SD2 may be electrically connected to a corresponding one of the interconnection lines through the contact plug. The contact plugs and the interconnection lines may be formed of or include a conductive material.

FIGS. 3A to 9A are perspective views illustrating a method of fabricating a semiconductor device, according to some examples of the inventive concept. FIGS. 3B and 3C are sectional views illustrating sections taken along lines I-I', II-If, and IV-IV' of FIG. 3A, FIGS. 4B to 9B are sectional views illustrating sections taken along lines A-A, B-B, and C-C' of FIGS. 4A to 9A, respectively, and FIGS. 4C to 9C are sectional views illustrating sections taken along lines D-D', E-E', and F-F' of FIGS. 4A to 9A, respectively.

Figure 3A:
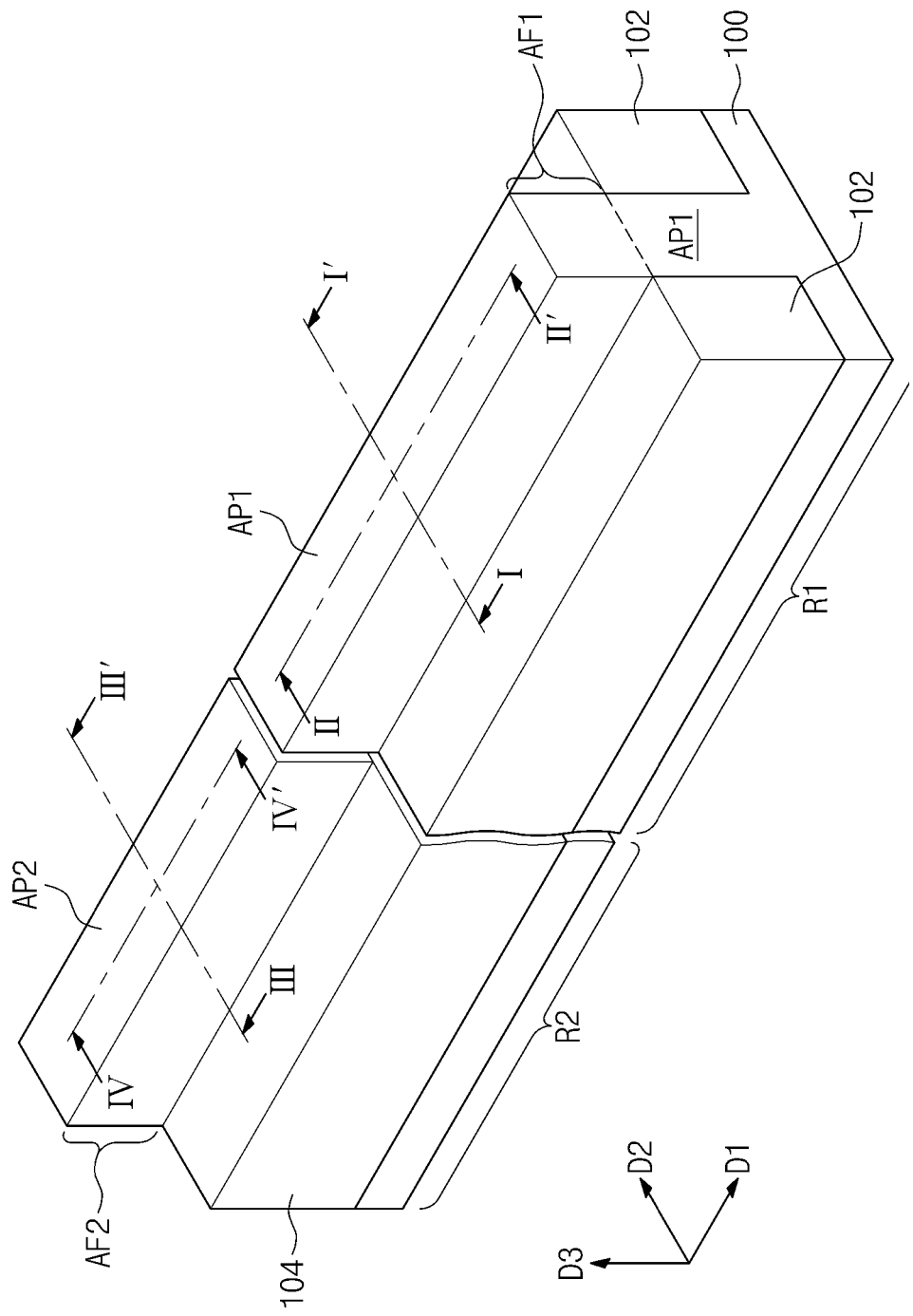
FIGS. 3A, 4A, 5A, 6A, 7A, 8A and 9A are perspective views illustrating a method of fabricating a semiconductor device, according to some examples of the inventive concept.
Figure 3B:
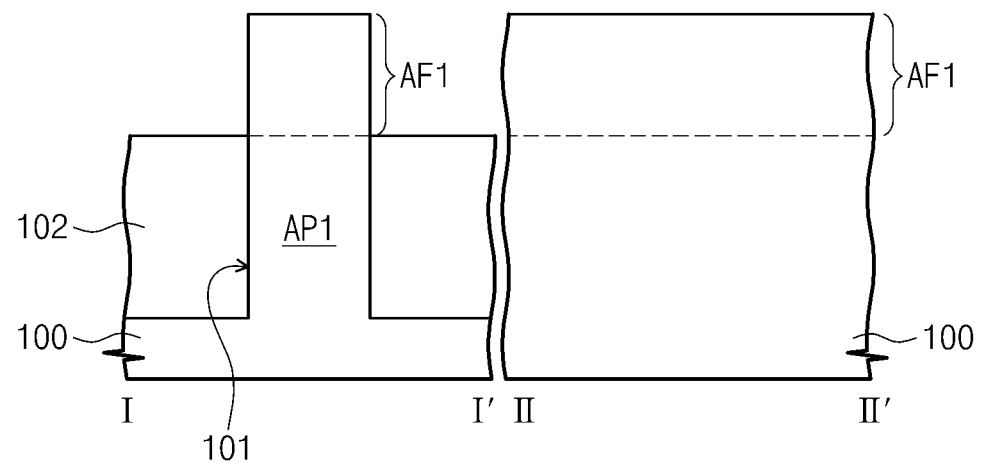
FIGS. 3B and 3C are sectional views illustrating sections taken along lines I-I', II-II', III-III', and IV-IV' of FIG. 3A.
Figure 3C:
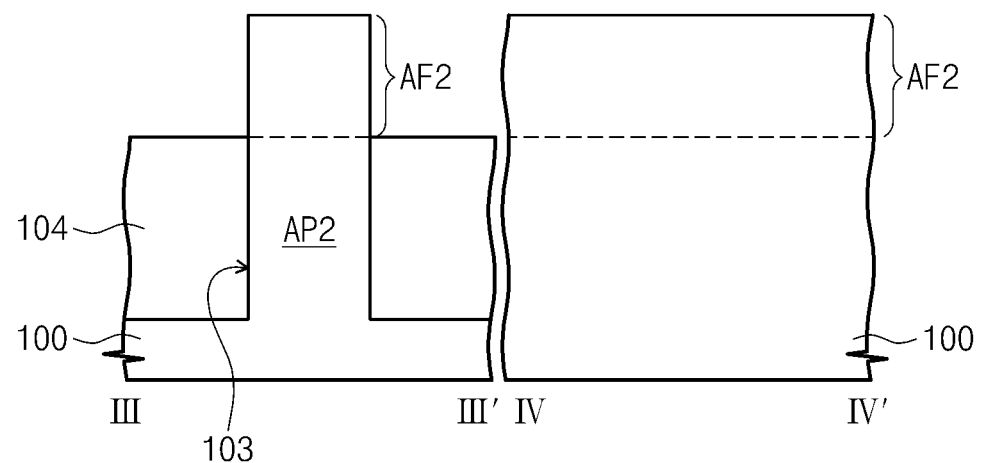

Referring to FIGS. 3A to 3C, the substrate 100 with the first and second regions R1 and R2 may be provided. The substrate 100 may be a bulk silicon wafer or a silicon-on-insulator (SOI) wafer. In the first region R1, the substrate 100 may be patterned to form first trenches 101 defining the first active pattern AP1. In the second region R2, the substrate 100 may be patterned to form second trenches 103 defining the second active pattern AP2. The first trenches 101 and the second trenches 103 may be formed simultaneously using the same process. The first trenches 101 may extend in the first direction D1 and may be spaced apart from each other in the second direction D2 crossing the first direction D1. Accordingly, the first active pattern AP1 may have a linear shape extending in the first direction D1. In addition, the second trenches 103 may extend in the first direction D1 and may be spaced apart from each other in the second direction D2. Accordingly, the second active pattern AP2 may have a linear shape extending in the first direction D1.

The forming of the first and second trenches 101 and 103 may include forming mask patterns on the substrate 100 and anisotropically etching the substrate 100 using mask patterns as an etch mask. Although not shown, each of the first and second trenches 101 and 103 may be formed to have a downwardly decreasing width, and thus, each of the first and second active patterns AP1 and AP2 may be formed to have an upwardly decreasing width.

The first device isolation patterns 102 may be formed to fill the first trenches 101 and the second device isolation patterns 104 may be formed to fill the second trenches 103. The forming of the first and second device isolation patterns 102 and 104 may include forming a device isolation layer on the substrate 100 to fill the first and second trenches 101 and 103 and planarizing the device isolation layer to expose the mask pattern.

Subsequently, the first and second device isolation patterns 102 and 104 may be vertically recessed to expose upper portions of the first and second active patterns AP1 and AP2. The vertical recessing of the first and second device isolation patterns 102 and 104 may be performed using, for example, a wet etching process having an etch selectivity with respect to the first and second active patterns AP1 and AP2. The upper portion of the first active pattern AP1 exposed by the first device isolation patterns 102 will be used as the first active fin AF1, and the upper portion of the second active pattern AP2 exposed by the second device isolation patterns 104 will be used as the second active fin AF2. The vertical recessing of the first and second device isolation patterns 102 and 104 may be performed to remove the mask patterns and to thereby expose the top surfaces of the first and second active fins AF1 and AF2.

Figure 4A:
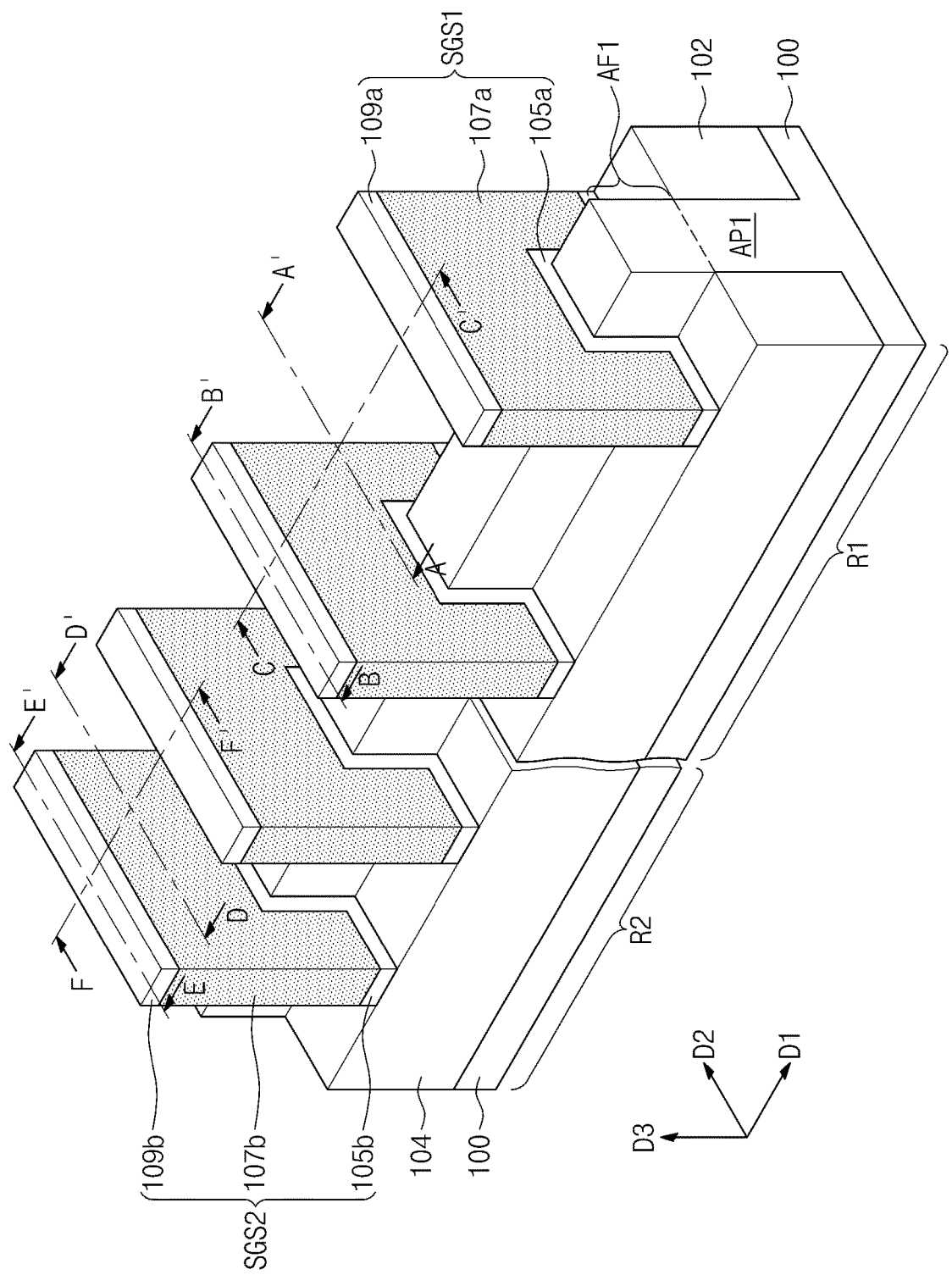
Figure 4B:
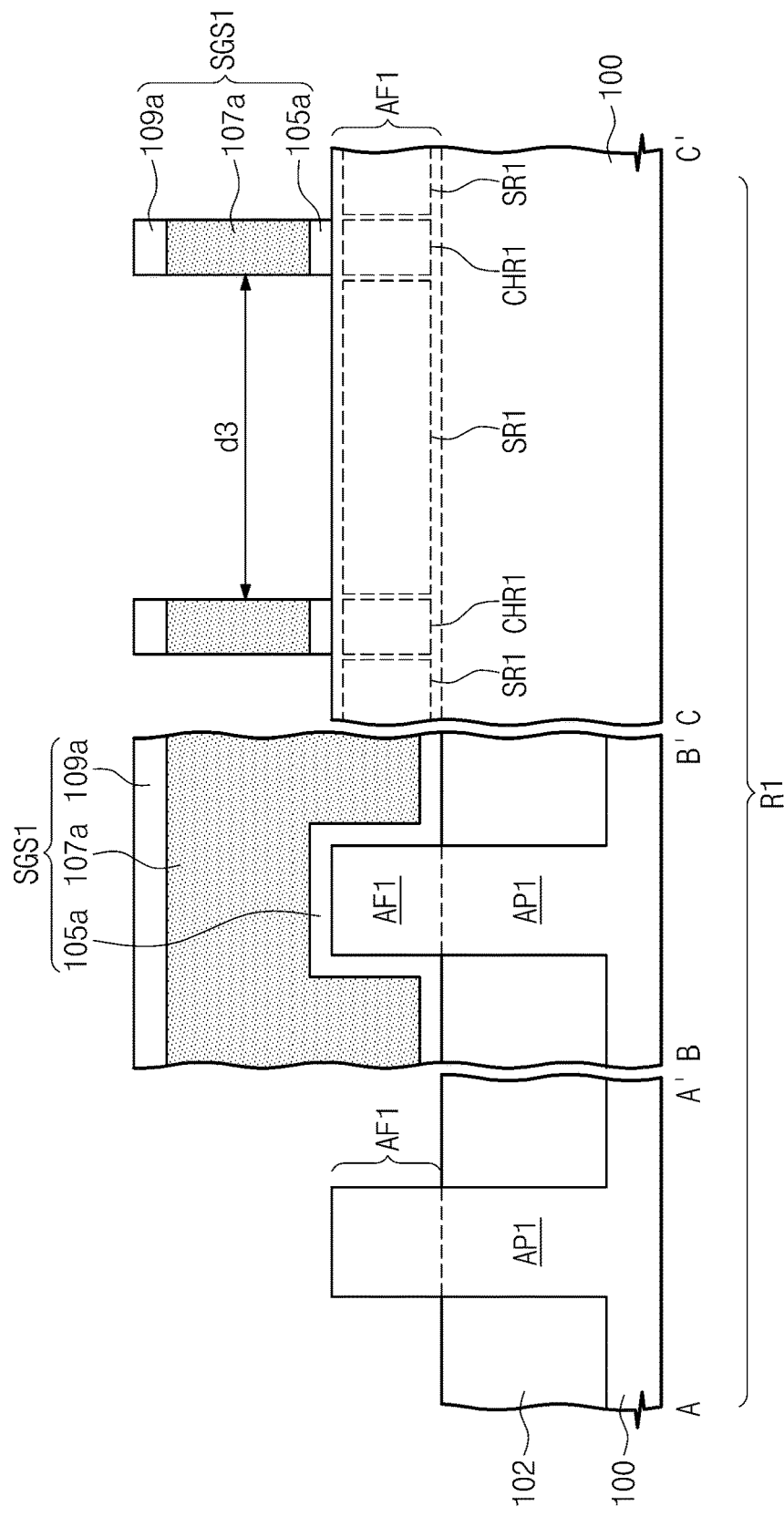
FIGS. 4B, 5B, 6B, 7B, 8B and 9B are sectional views illustrating sections taken along lines A-A', B-B, and C-C' of FIGS. 4A to 9A, respectively.
Figure 4C:
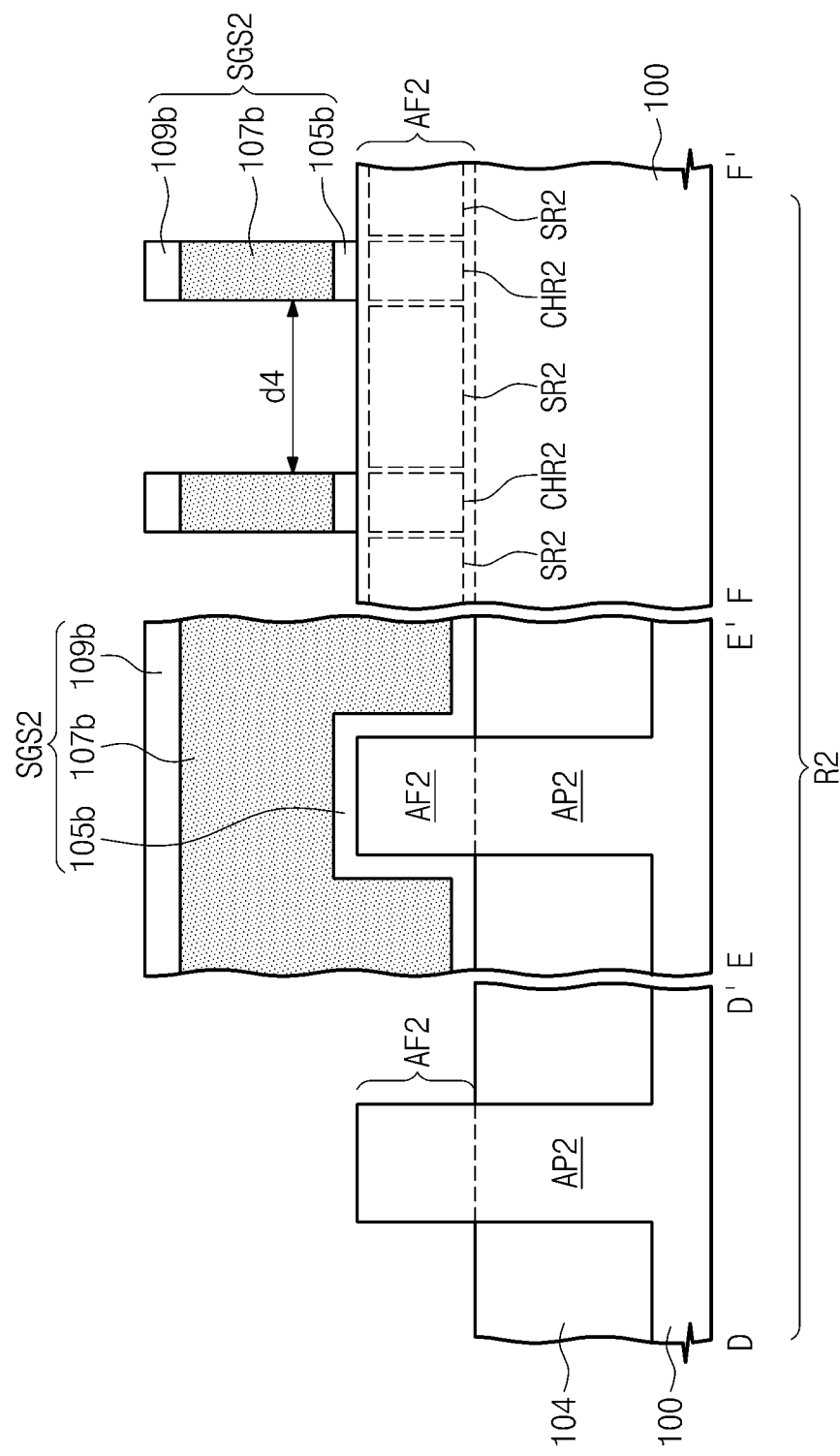
FIGS. 4C, 5C, 6C, 7C, 8C and 9C are sectional views illustrating sections taken along lines D-D', E-E', and F-F' of FIGS. 4A to 9A, respectively.

Referring to FIGS. 4A to 4C, the etch stop layer and the sacrificial gate layer may be sequentially formed on the substrate 100 to cover the first and second active fins AF1 and AF2. The etch stop layer may include, for example, a silicon oxide layer. The sacrificial gate layer may include material having an etch selectivity with respect to the etch stop layer. The sacrificial gate layer may be, for example, a polysilicon layer.

The sacrificial gate layer may be patterned to form a first sacrificial gate pattern 107a and a second sacrificial gate pattern 107b on the substrate 100, and the first and second sacrificial gate patterns 107a and 107b may be formed to cross the first and second active fins AF1 and AF2, respectively. The forming of the first and second sacrificial gate patterns 107a and 107b may include forming a first gate mask pattern 109a on the sacrificial gate layer of the first region R1, forming a second gate mask pattern 109b on the sacrificial gate layer of the second region R2, and etching the sacrificial gate layer using the first and second gate mask patterns 109a and 109b as an etch mask. The first and second gate mask patterns 109a and 109b may be constituted by, for example, a silicon nitride layer. The etching of the sacrificial gate layer may be performed using an etching recipe having an etch selectivity with respect to the etch stop layer.

After the forming of the first and second sacrificial gate patterns 107a and 107b, the etch stop layer may be etched to form a first etch stop pattern 105a below the first sacrificial gate pattern 107a and a second etch stop pattern 105b below the second sacrificial gate pattern 107b. The first etch stop pattern 105a may extend along a bottom surface of the first sacrificial gate pattern 107a to partially cover the top surfaces of the first device isolation patterns 102. The second etch stop pattern 105b may extend along a bottom surface of the second sacrificial gate pattern 107b to partially cover the top surfaces of the second device isolation patterns 104.

Since the first sacrificial gate pattern 107a is formed to cross the first active fin AF1, a first channel region CHR1 and first sacrificial regions SR1 may be defined in each of the first active fins AF1. The first channel region CHR1 may be a portion of the first active fin AF1 that is positioned below and overlapped by the first sacrificial gate pattern 107a. The first sacrificial regions SR1 may be other portions of the first active fin AF1 that are positioned at both sides of the first sacrificial gate pattern 107a and are horizontally separated from each other by the first channel region CHR1.

In addition, since the second sacrificial gate pattern 107b is formed to cross the second active fin AF2, a second channel region CHR2 and second sacrificial regions SR2 may be defined in each of the second active fins AF2. The second channel region CHR2 may be a portion of the second active fin AF2 that is positioned below and overlapped by the second sacrificial gate pattern 107b. The second sacrificial regions SR2 may be other portions of the second active fin AF2 that are positioned at both sides of the second sacrificial gate pattern 107b and are horizontally separated from each other by the second channel region CHR2.

The first etch stop pattern 105a, the first sacrificial gate pattern 107a, and the first gate mask pattern 109a may constitute a first sacrificial gate structure SGS1, and the second etch stop pattern 105b, the second sacrificial gate pattern 107b, and the second gate mask pattern 109b may constitute a second sacrificial gate structure SGS2.

In some examples, a plurality of first sacrificial gate structures SGS1 may be formed on the first region R1 of the substrate 100 to cross the first active pattern AP1, and a plurality of second sacrificial gate structures SGS2 may be formed on the second region R2 of the substrate 100 to cross the second active pattern AP2. A third distance d3 between adjacent ones of the first sacrificial gate structures SGS1 may be greater than a fourth distance d4 between adjacent ones of the second sacrificial gate structures SGS2. Accordingly, a length of the first active fin AF1 exposed by the adjacent ones of the first sacrificial gate structures SGS1 may be greater than a length of the second active fin AF2 exposed by the adjacent ones of the second sacrificial gate structures SGS2. Here, the length of the first active fin AF1 refers to the dimension of the exposed portion thereof in the longitudinal direction (e.g., the first direction D1) of the first active pattern AP1, and the length of each of the second sacrificial regions SR2 refers to the dimension of the exposed portion thereof in the longitudinal direction (e.g., the first direction D1) of the second active pattern AP2.

Figure 5A:
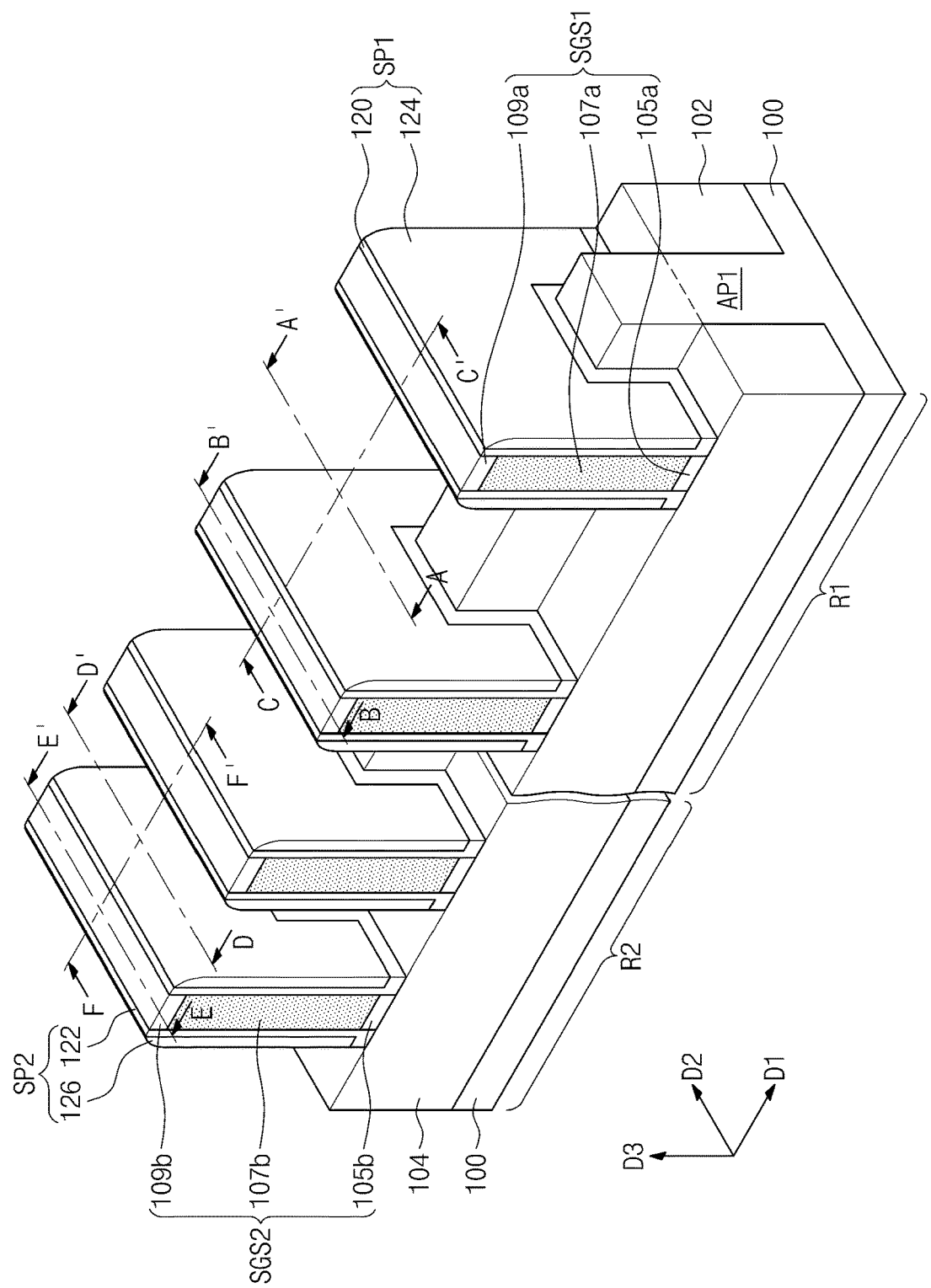
Figure 5B:
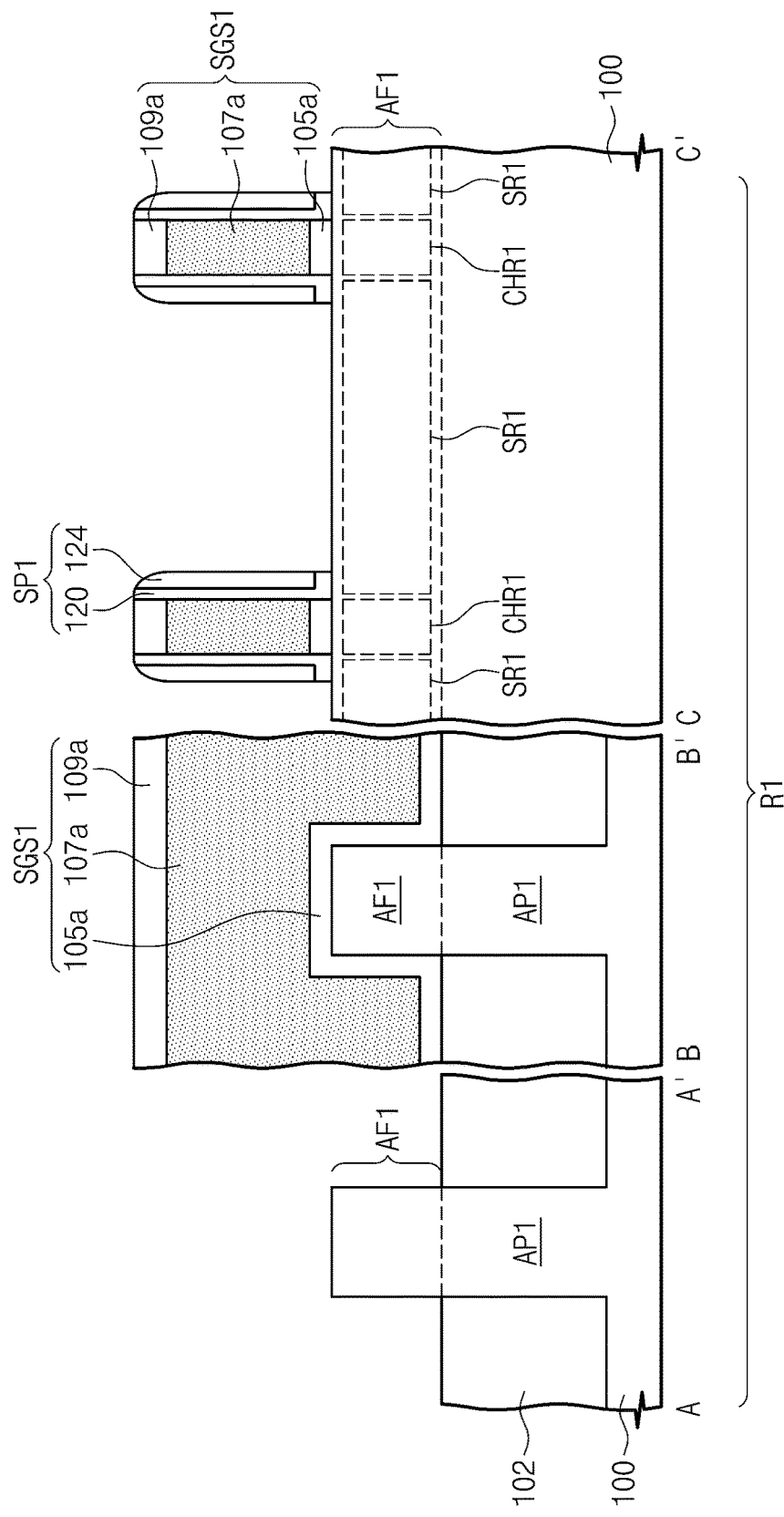
Figure 5C:
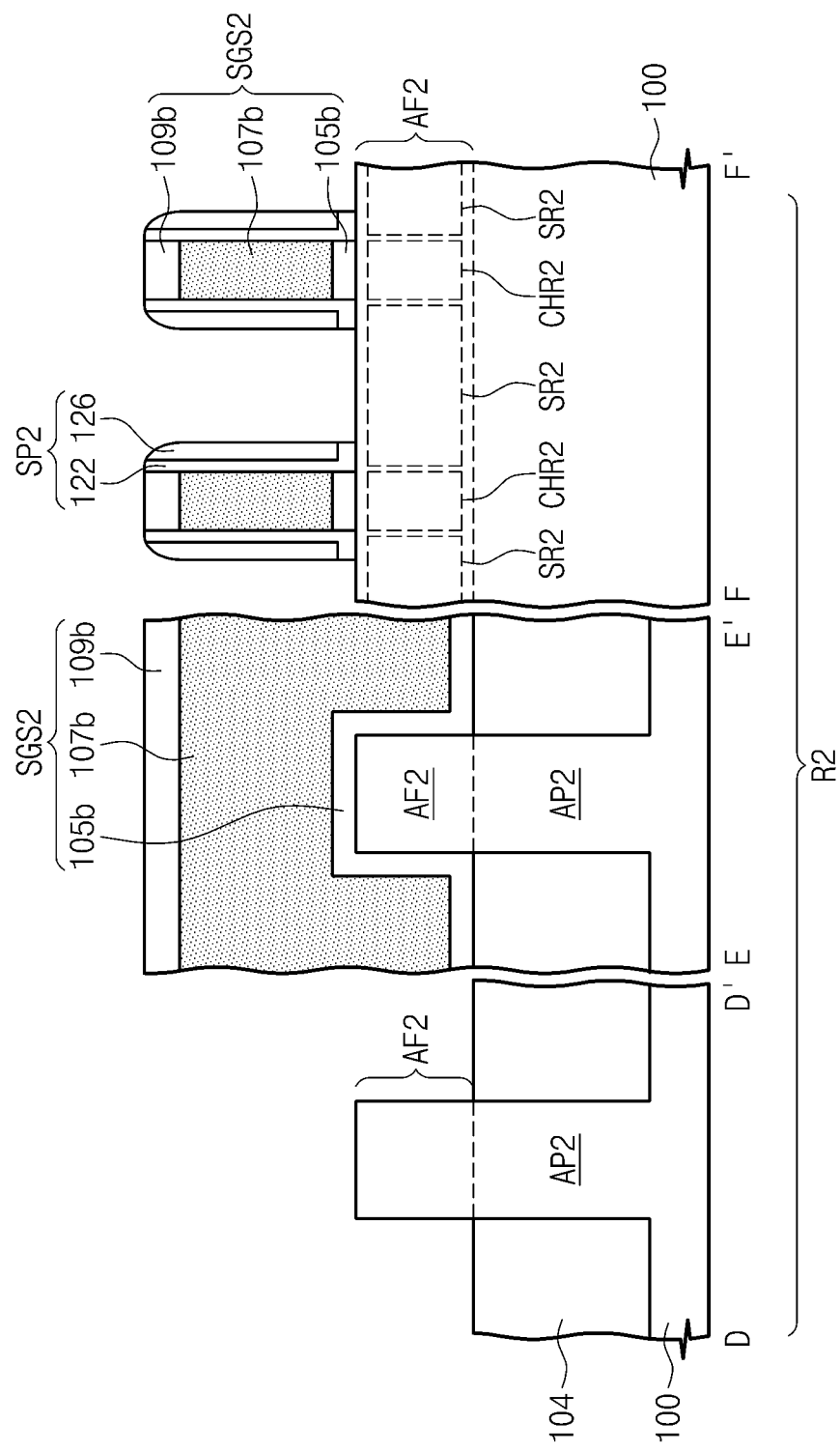

Referring to FIGS. 5A to 5C, a gate spacer layer and a spacer sacrificial layer may be formed on the substrate 100. The gate spacer layer may be formed to conformally cover the first and second active patterns AP1 and AP2 and the first and second sacrificial gate structures SGS1 and SGS2. Subsequently, the spacer sacrificial layer may be conformally formed on the gate spacer layer. The gate spacer layer may include a silicon nitride layer, and the spacer sacrificial layer may include an oxide layer. The gate spacer layer and the spacer sacrificial layer may be formed by, for example, a chemical vapor deposition process.

The gate spacer layer and the spacer sacrificial layer may be patterned to form first and second spacer structures SP1 and SP2. For example, an anisotropic etching process may be performed to form the first and second spacer structures SP1 and SP2. The first spacer structure SP1 may include the first gate spacer 120 and a first sacrificial spacer 124. The first gate spacer 120 and the first sacrificial spacer 124 may be formed on an outer side surface of the first sacrificial gate pattern 107a. The second spacer structure SP2 may include the second gate spacer 122 and a second sacrificial spacer 126. The second gate spacer 122 and the second sacrificial spacer 126 may be formed on an outer side surface of the second sacrificial gate pattern 107b.

Figure 6A:
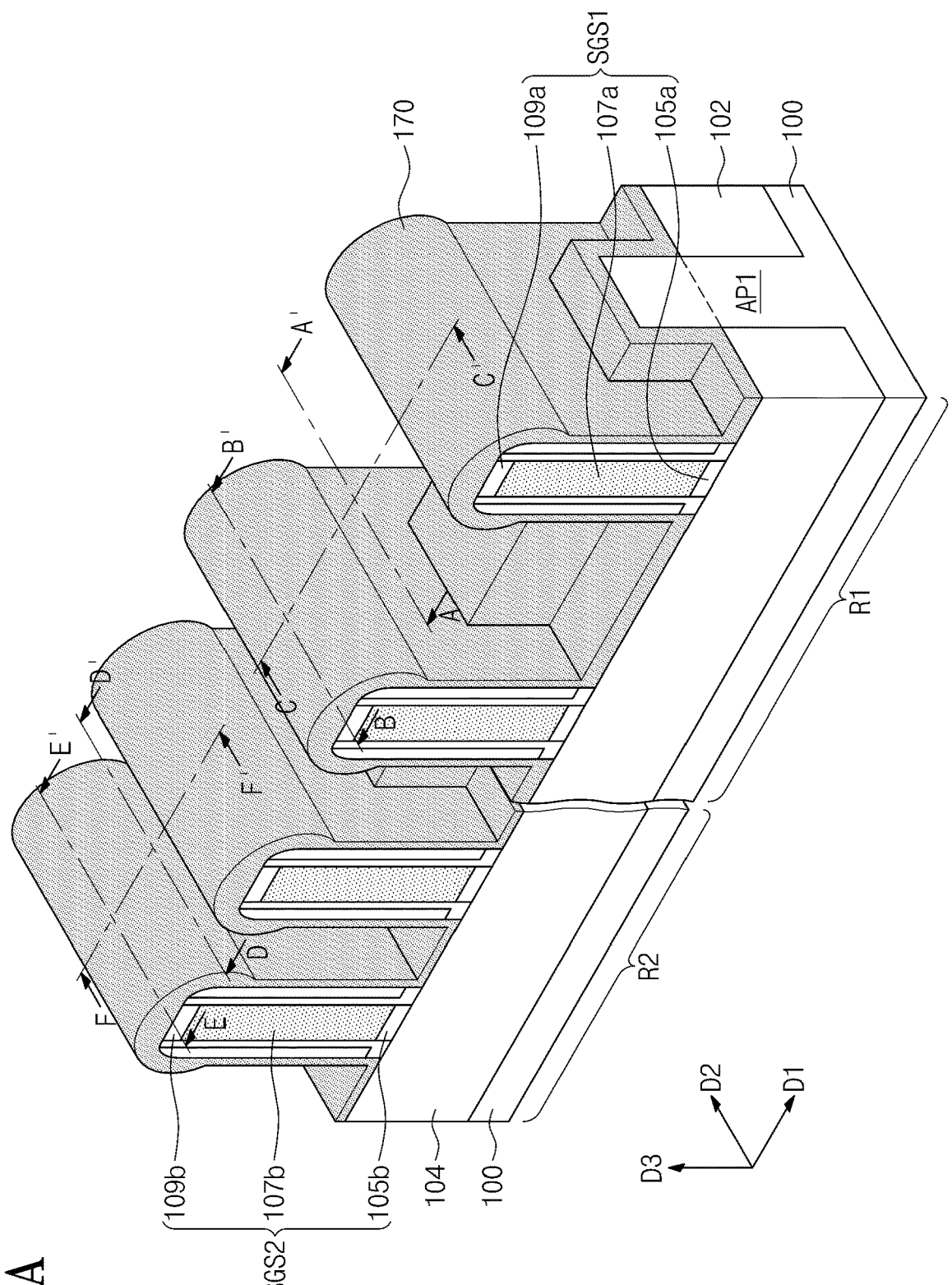
Figure 6B:
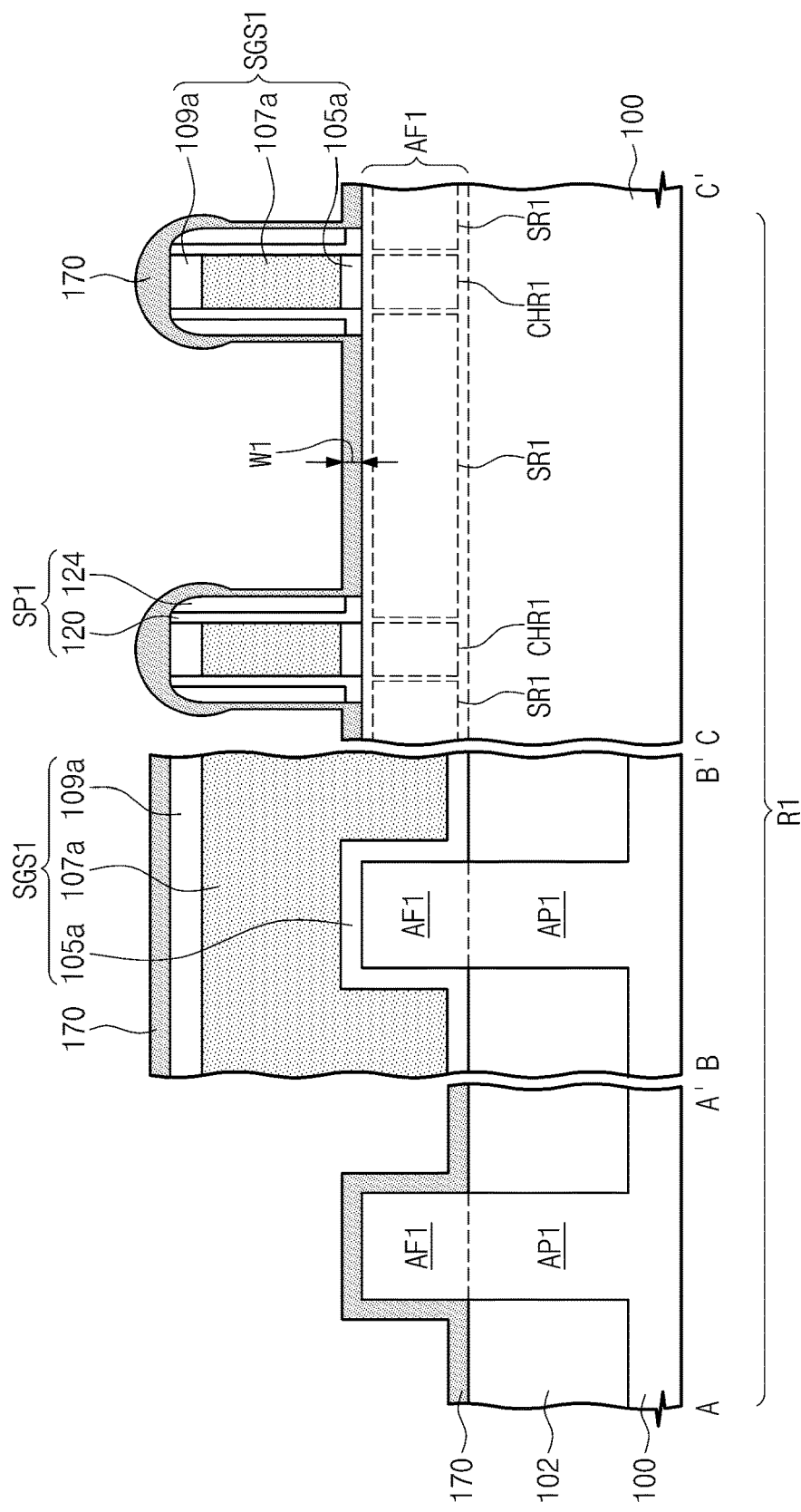
Figure 6C:
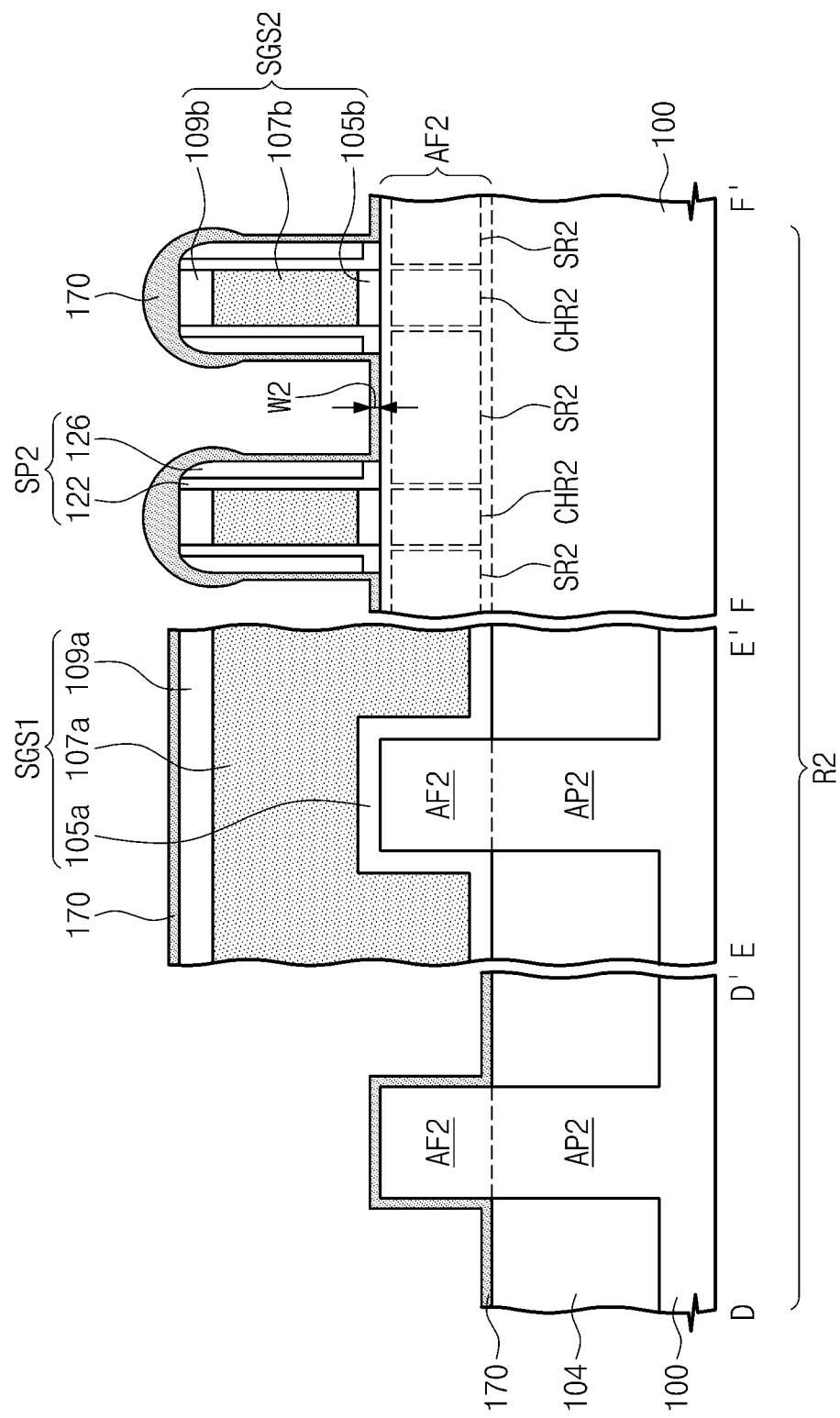

Referring to FIGS. 6A to 6C, a coating layer 170 may be formed on the substrate 100. The coating layer 170 may be formed to conformally cover the first and second active patterns AP1 and AP2, the first and second sacrificial gate structures SGS1 and SGS2, and the first and second spacer structures SP1 and SP2. The coating layer 170 may include a silicon oxide layer. For example, the coating layer 170 may be a silicon oxide layer which may be deposited by a chemical reaction between silicon tetrachloride ($SiCl_4$) and oxygen ($O_2$). The coating layer 170 may be of the same material as the first and second sacrificial spacers 124 and 126. In this case, the first and second sacrificial spacers 124 and 126 do not have to be formed thickly.

The coating layer 170 may be formed under a low pressure condition. For example, the coating layer 170 may be formed under a pressure condition of about 1 mTorr to about 100 mTorr. Furthermore, in the case where a PECVD method is used to form the coating layer 170, the coating layer 170 may be formed under a bias power condition of about 100V or less. The coating layer 170 may be formed to have a first thickness w1 on the first active pattern AP1 and first sacrificial region SR1 and a second thickness w2 on the second active pattern AP2 and second sacrificial region SR2. The second thickness w2 may be different from the first thickness w1. The second thickness w2 may be smaller than the first thickness w1. In other words, in the case where the deposition process is performed under the process condition of low pressure and low power, a difference in geometry between topography on the first and second regions R1 and R2 may lead to a difference in thickness of the coating layer 170 (i.e., w1≠w2). For example, the deposition process proceeds more easily or rapidly on the first region R1 than on the second region R2 because a distance between the first sacrificial gate structures SGS1 on the first region R1 is greater than that between the second sacrificial gate structures SGS2 on the second region R2. This may lead to a difference in thicknesses of the coating layer 170 between the first and second regions R1 and R2 (i.e., w1≠w2). In addition, the coating layer 170 may be formed to have a relatively large thickness on the first and second sacrificial gate structures SGS1 and SGS2. As an example, the thickness of the coating layer 170 on the first and second sacrificial gate structures SGS1 and SGS2 may be larger than the second thickness w2.

Figure 7A:
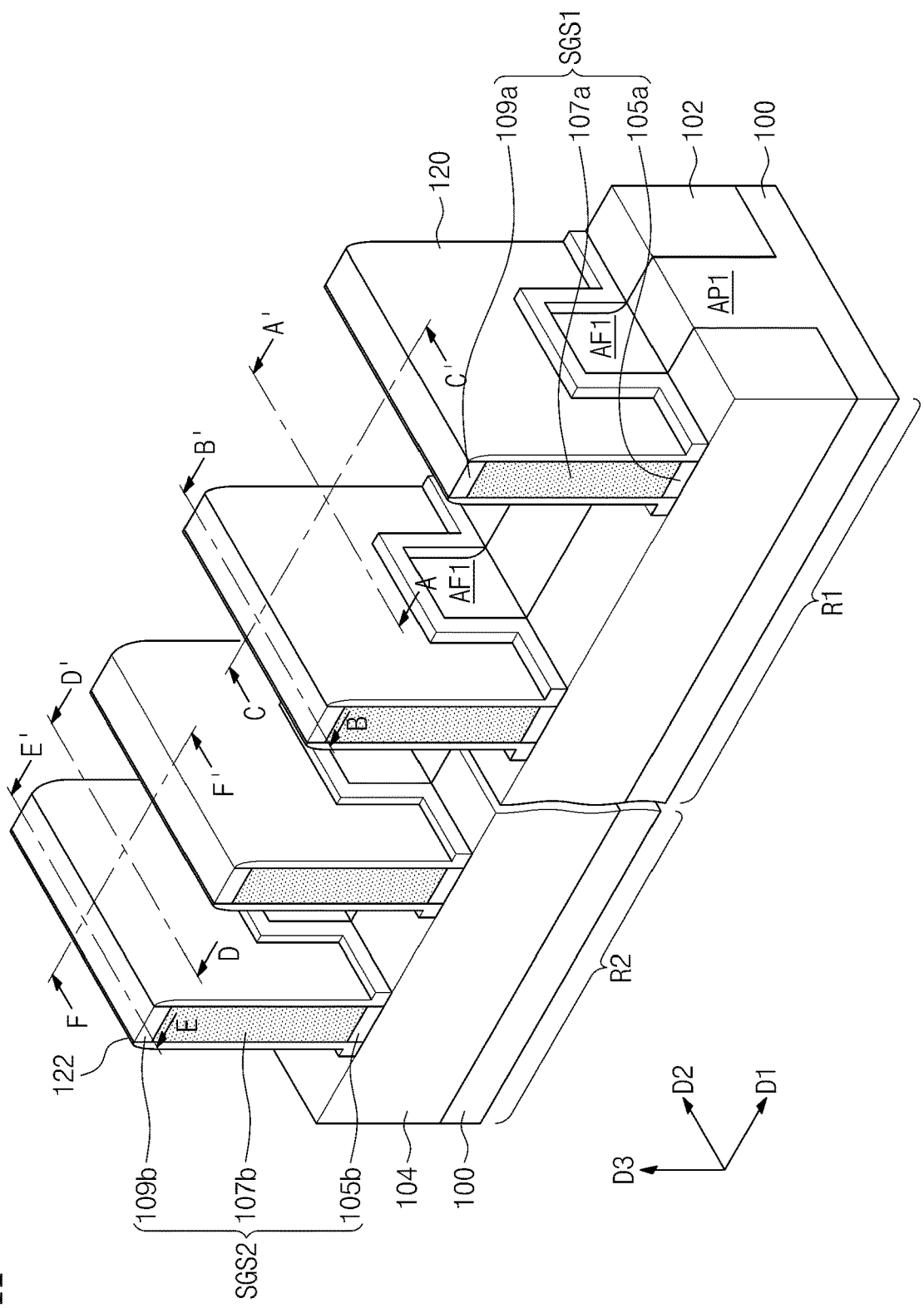
Figure 7B:
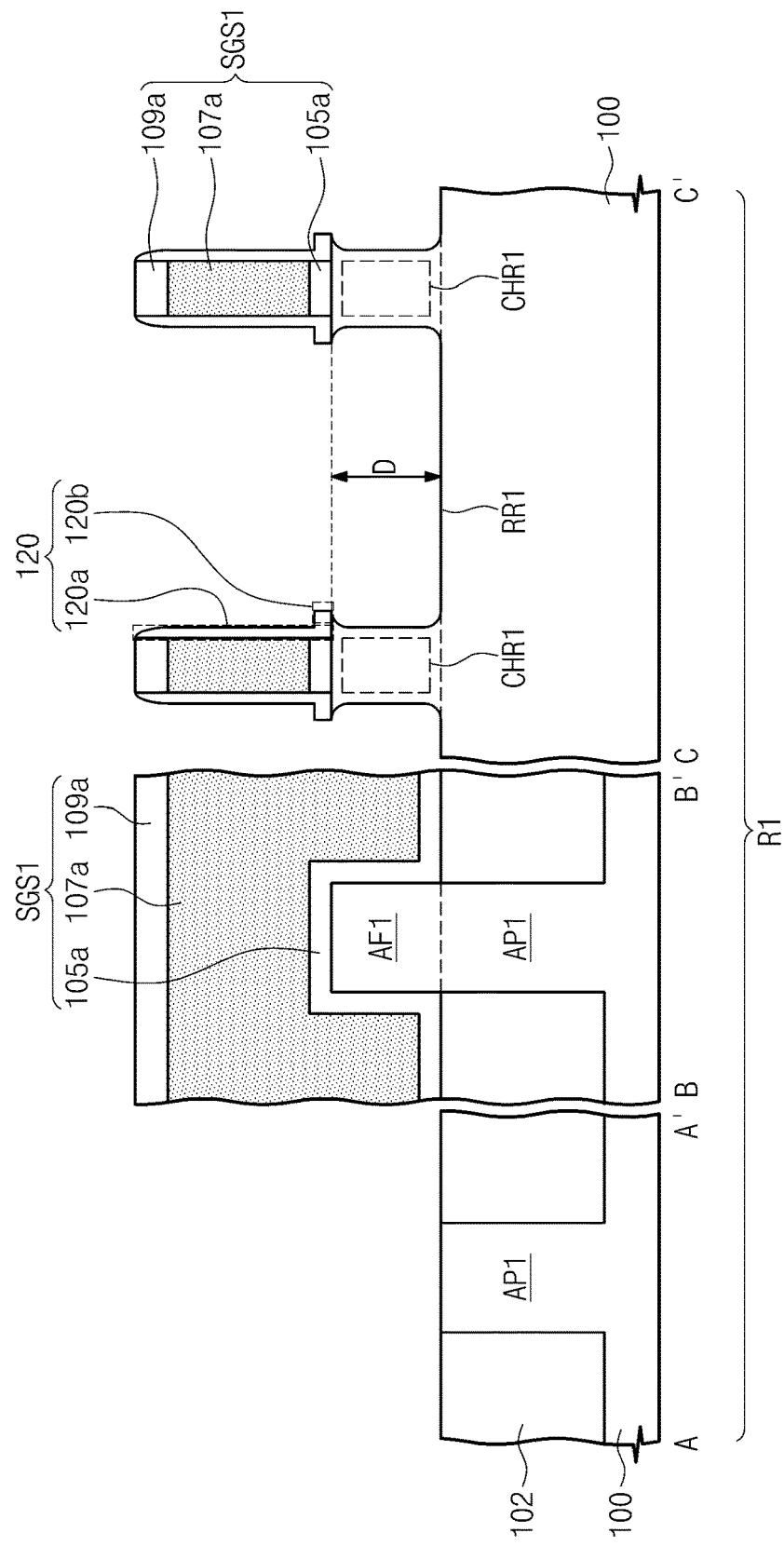
Figure 7C:
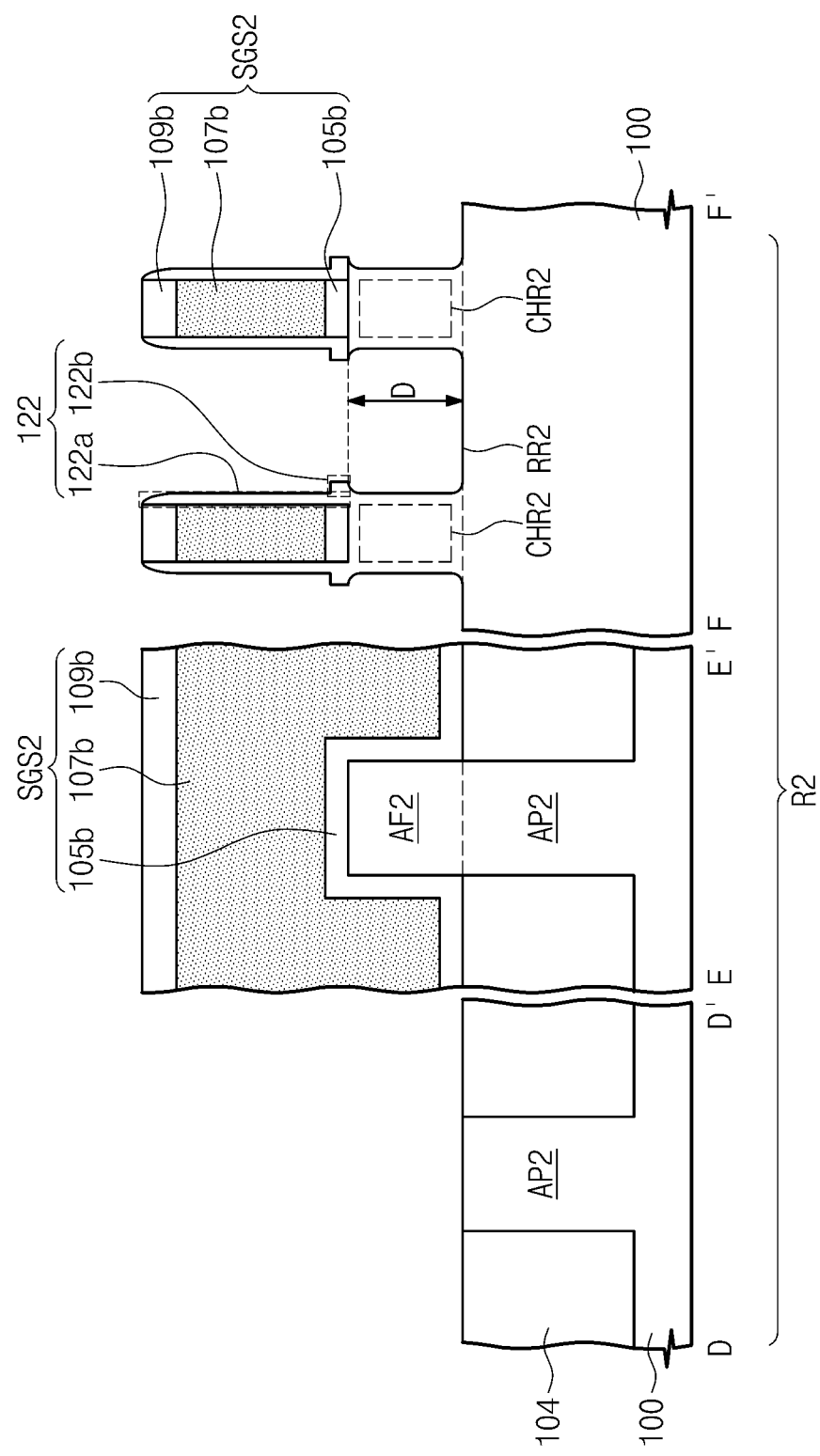

Referring to FIGS. 7A to 7C, after the forming of the coating layer 170, a recess process may be performed to form first and second recess regions RR1 and RR2. The first recess region RR1 may be formed in the first active pattern AP1 between the first sacrificial gate structures SGS1. For example, the recess process may be performed to remove the first sacrificial regions SR1 of the first active fin AF1. The removal of the first sacrificial regions SR1 may be performed using a dry or wet etching process. The first recess region RR1 may define a recess of a predetermined depth D. The second recess region RR2 may be formed in the second active pattern AP2 between the second sacrificial gate structures SGS2. For example, the recess process may be performed to remove the second sacrificial regions SR2 of the second active fin AF2. The removal of the second sacrificial regions SR2 may be performed using a dry or wet etching process. The second recess region RR2 may also define a recess of the predetermined depth D. In some examples, the removal of the first and second sacrificial regions SR1 and SR2 may include etching the first and second sacrificial regions SR1 and SR2 using an etching process formulated to have a relatively high etch selectivity with respect to the gate spacer layer. Here, the upper portions of the first and second sacrificial regions SR1 and SR2 in contact with the first and second spacers 120 and 122 may be recessed along the bottom surfaces of the first and second spacers 120 and 122. As an example, the upper portions of the first and second sacrificial regions SR1 and SR2 in contact with the first and second spacers 120 and 122 may be rounded in a direction toward the first and second channel regions CHR1 and CHR2.

In the hypothetical case in which the recess process were to be performed on both of the first and second sacrificial regions SR1 and SR2 without the coating layer 170, the depth of the recess formed by etching the first sacrificial region SR1 would be greater than the depth of the recess formed by etching the second sacrificial region SR2, because the exposed area of the first sacrificial region SR1 would be relatively large. However, according to some examples of the inventive concept, the coating layer 170 is formed to different thicknesses (i.e., w1 and w2) on the first and second regions R1 and R2, before the recess process is preformed on the first and second sacrificial regions SR1 and SR2. This makes it possible to minimize or eliminate a difference depth of the recesses formed by etching the first and second sacrificial regions SR1 and SR2. In certain examples, the recess formed by etching the first sacrificial region SR1 may be shallower than that formed by etching the second sacrificial region SR2.

The process of forming the first and second recess regions RR1 and RR2 may include repeatedly performing a cycle including steps of coating and etching a layer. For example, a first cycle including steps of coating and etching a layer may be firstly performed, and then, a second cycle including steps of coating and etching a layer may be secondly performed. The cycle including steps of coating and etching a layer may be performed in an in-situ manner, and this may make it possible to change a process condition during the overall course of the process, without temporal and spatial limitations.

During the recess process, the first and second spacer structures SP1 and SP2 may be partially etched. As an example, side portions of the first and second spacer structures SP1 and SP2 may be etched during the recess process. Here, since the coating layer 170 is formed to be thicker on the first region R1 than on the second region R2, the amount of the first spacer structure SP1 removed by the etching process may be smaller than that of the second spacer structure SP2 removed by the etching process. Accordingly, in the case where the first and second sacrificial spacers 124 and 126 are removed through a cleaning process after the recess process, the amount of the first gate spacer 120 remaining after the cleaning process may be greater than that of the second gate spacer 122. In some examples, the cleaning process for removing the first and second sacrificial spacers 124 and 126 may be performed using hydrofluoric acid (HF).

Referring back to FIGS. 2A and 2B, the first protrusion 120b outwardly protruding from the first sacrificial gate pattern 107a may be formed at a lower portion of the first gate spacer 120. For example, the first protrusion 120b may be a lower portion of the first gate spacer 120 protruding in the first direction D1 with respect to the first portion 120a. The first protrusion 120b may protrude from the first portion 120a by the first length L1. The second protrusion 122b outwardly protruding from the second sacrificial gate pattern 107b may be formed at a lower portion of the second gate spacer 122. For example, the second protrusions 122b may be a lower portion of the second gate spacer 122 protruding in the first direction D1 with respect to the second portion 122a. The second protrusions 122b may protrude from the second portion 122a by the second length L2. Here, the second length L2 may be smaller than the first length L1. As an example, the second length L2 may be about 5 Å to about 2 nm smaller than the first length L1. For example, by controlling etching amounts of the first and second gate spacers 120 and 122, it is possible to make a difference in length between the first and second protrusions 120b and 122b. In certain examples, during the recess process, lower side portions of the first and second protrusions 120b and 122b may be recessed toward the first and second sacrificial gate patterns 107a and 107b.

Furthermore, according to some examples of the inventive concept, the coating layer 170 may protect the first and second gate mask patterns 109a and 109b and the first and second gate spacer layers 120 and 122 from being etched. Otherwise, the first and second gate mask patterns 109a and 109b and the first and second gate spacer layers 120 and 122 could be partially removed during the anisotropic etching process for forming the recess regions RR1 and RR2.

Figure 8A:
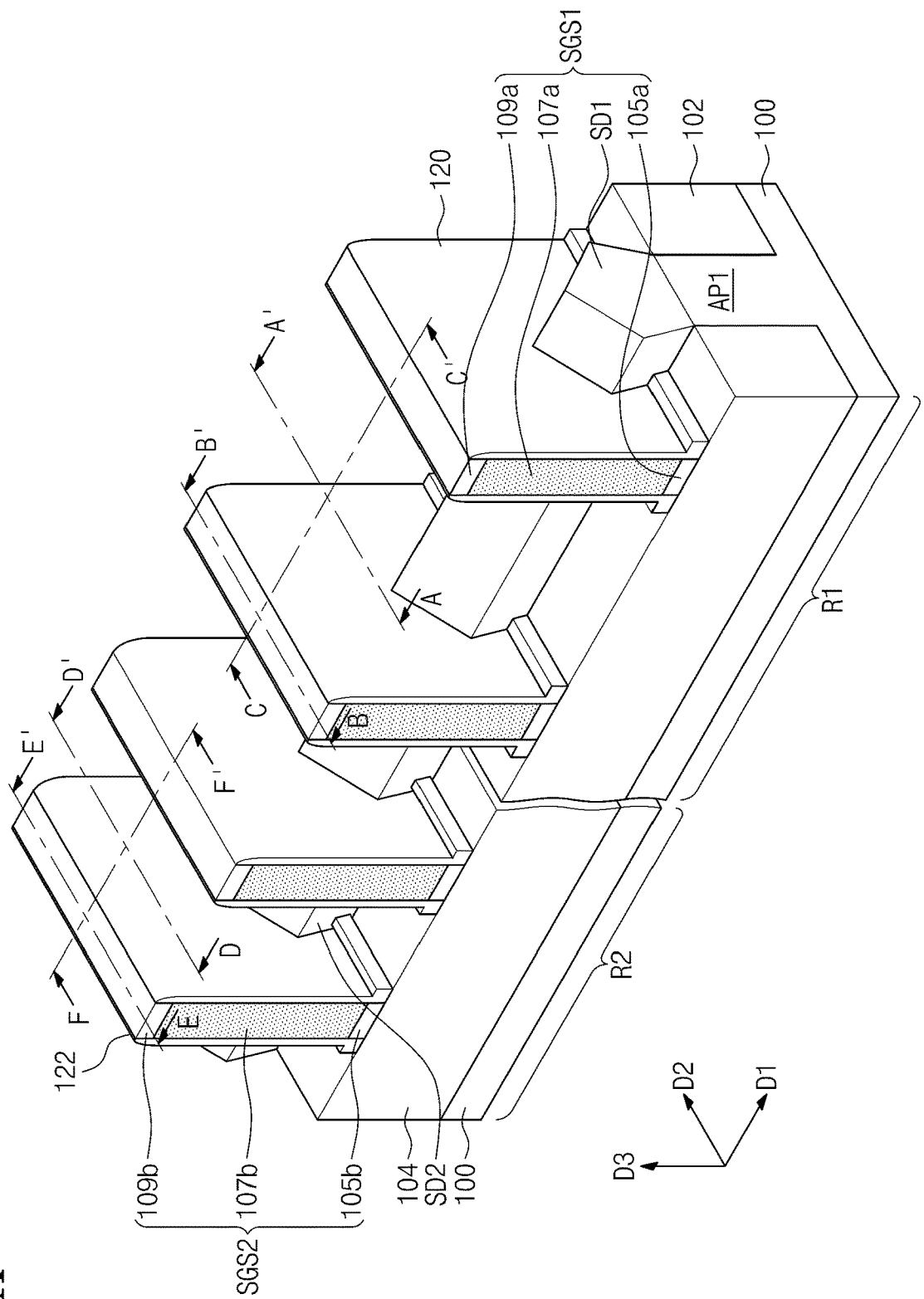
Figure 8B:
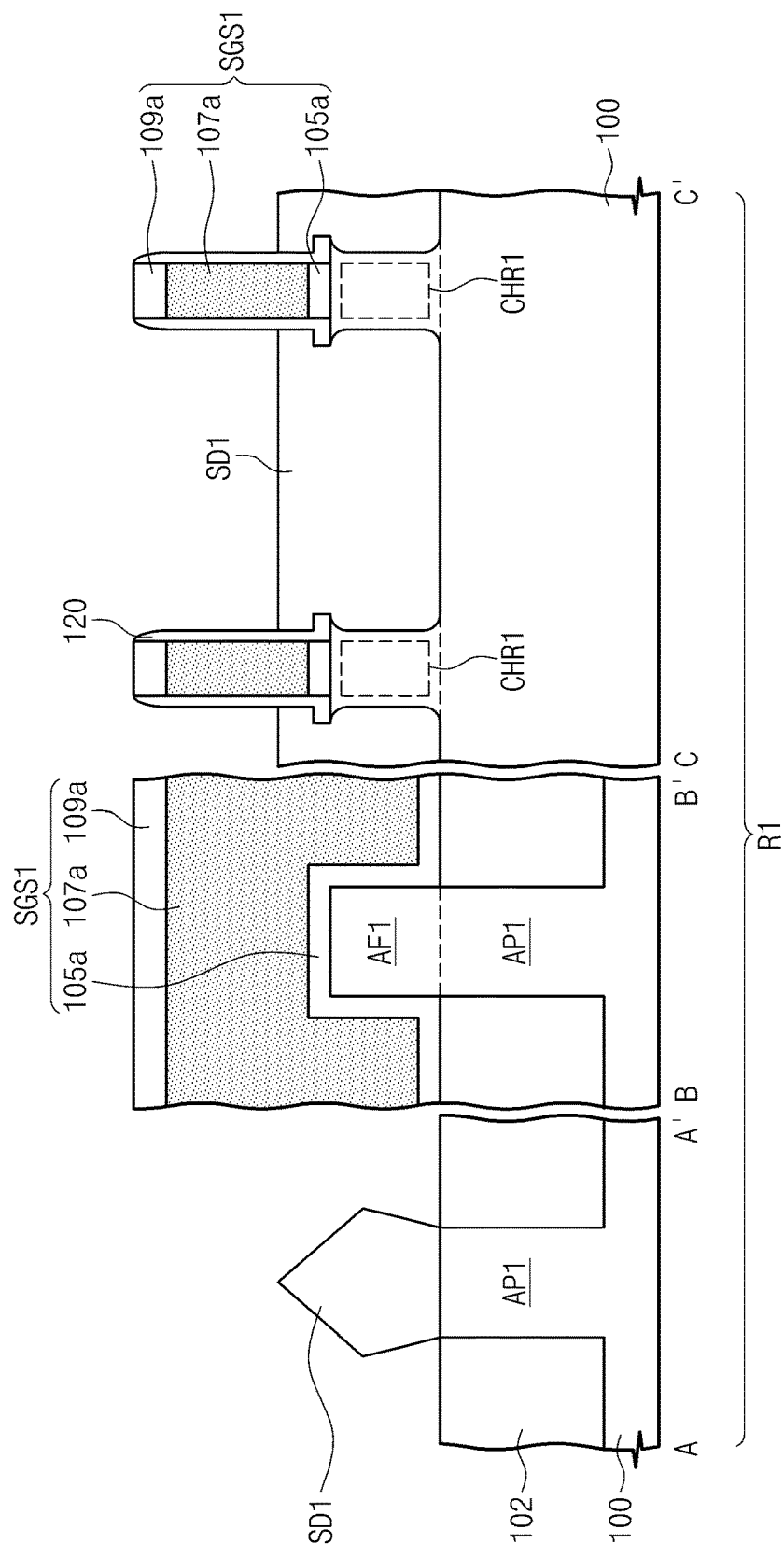
Figure 8C:
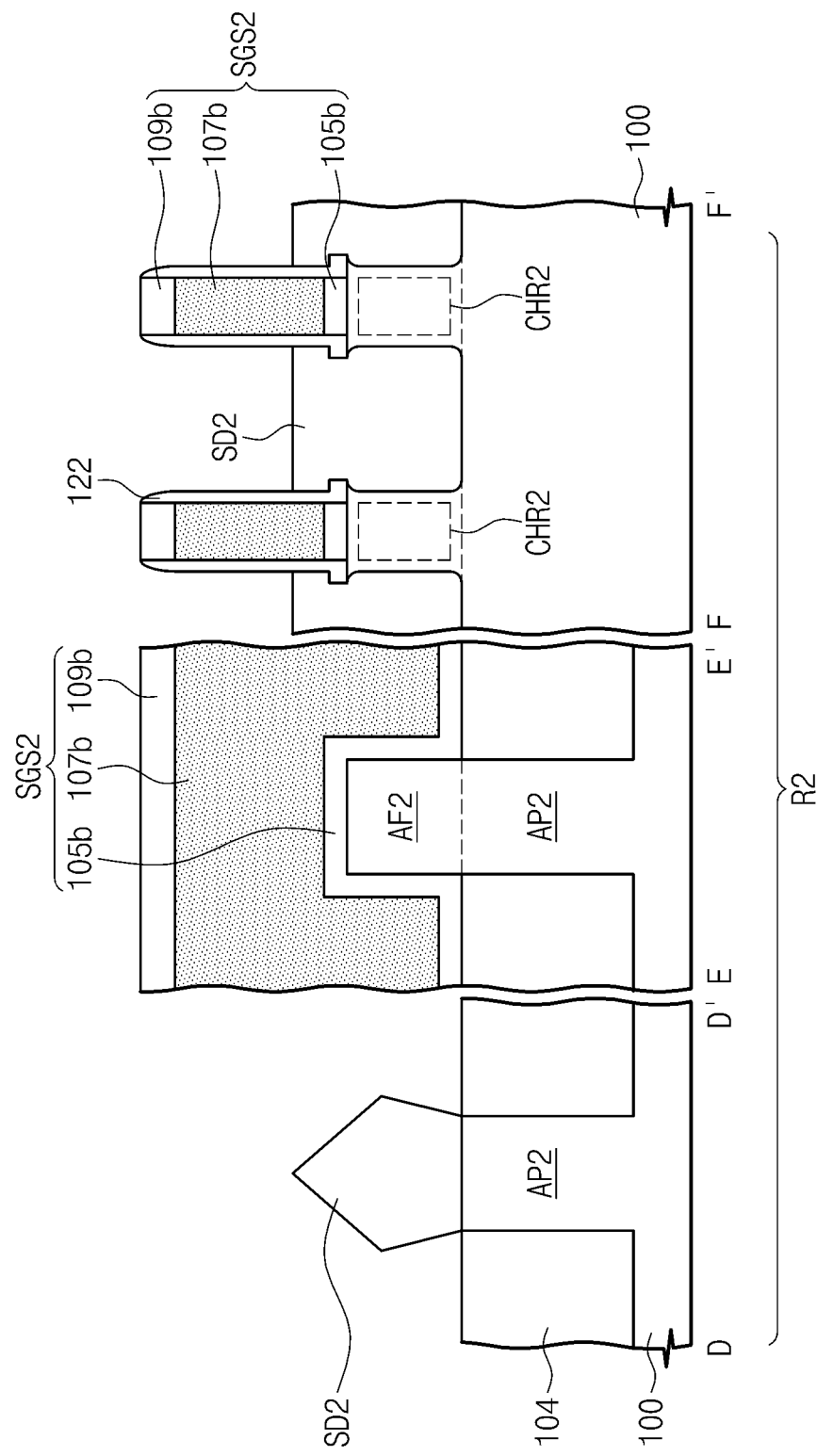

Referring to FIGS. 8A to 8C, the first source/drain regions SD1 may be formed at both sides of the first sacrificial gate structure SGS1, and the second source/drain regions SD2 may be formed at both sides of the second sacrificial gate structure SGS2. The first and second source/drain regions SD1 and SD2 may be formed using the same process.

The forming of the first and second source/drain regions SD1 and SD2 may include performing a selective epitaxial growth process on the substrate 100. For example, each of the first source/drain regions SD1 may be an epitaxial pattern grown using the first active pattern AP1 as a seed layer, and each of the second source/drain regions SD2 may be an epitaxial pattern grown using the second active pattern AP2 as a seed layer. The first and second source/drain regions SD1 and SD2 may include at least one of silicon germanium (SiGe), silicon (Si), and silicon carbide (SiC). In the case where the semiconductor device is a CMOS type of device, a first epitaxial layer may be formed to serve as source/drain electrodes of NMOSFETs, and a second epitaxial layer may be formed to serve as source/drain electrodes of PMOSFETs. The first epitaxial layer may be formed of a material capable of exerting a tensile stress on channel regions of the NMOSFETs, and the second epitaxial layer may be formed of a material capable of exerting a compressive stress on channel regions of the PMOSFETs. The first and second epitaxial layers may be formed of silicon carbide (SiC) and silicon germanium (SiGe), respectively, but the inventive concept may not be limited thereto. During or after the epitaxial process, the first and second source/drain regions SD1 and SD2 may be doped with impurities. Although not shown, each of the first and second source/drain regions SD1 and SD2 may include a plurality of epitaxial layers. As an example, each of the first and second source/drain regions SD1 and SD2 may include a first epitaxial layer (not shown), which serves as a buffer layer in contact with the first and second active patterns AP1 and AP2 and is formed of a lightly doped semiconductor material, a second epitaxial layer (not shown), which extends from the first epitaxial layer and is formed of a highly-doped semiconductor material, and a third epitaxial layer (not shown), which is provided on the second epitaxial layer (not shown) to serve as a capping layer.

Figure 9A:
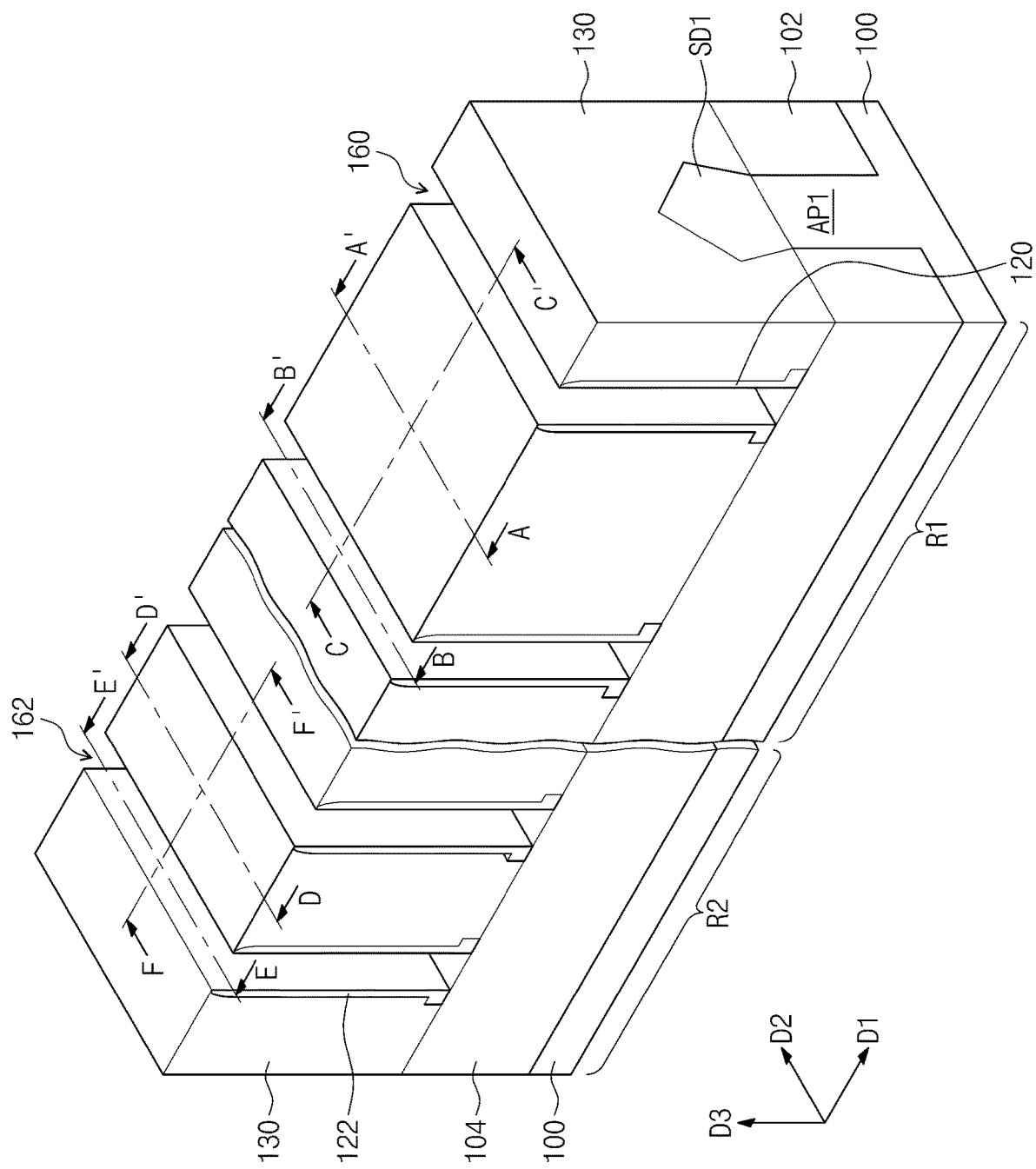
Figure 9B:
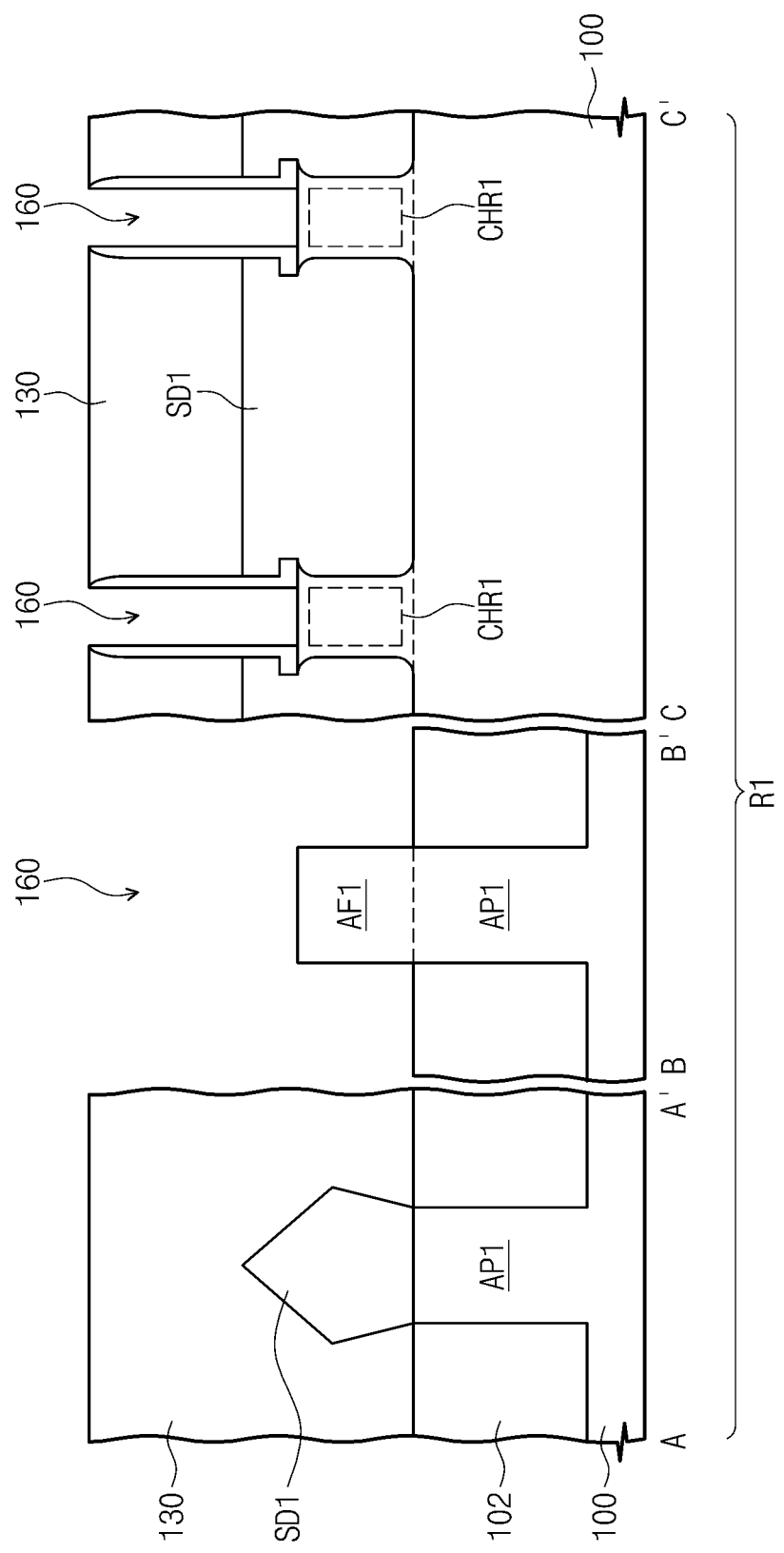
Figure 9C:
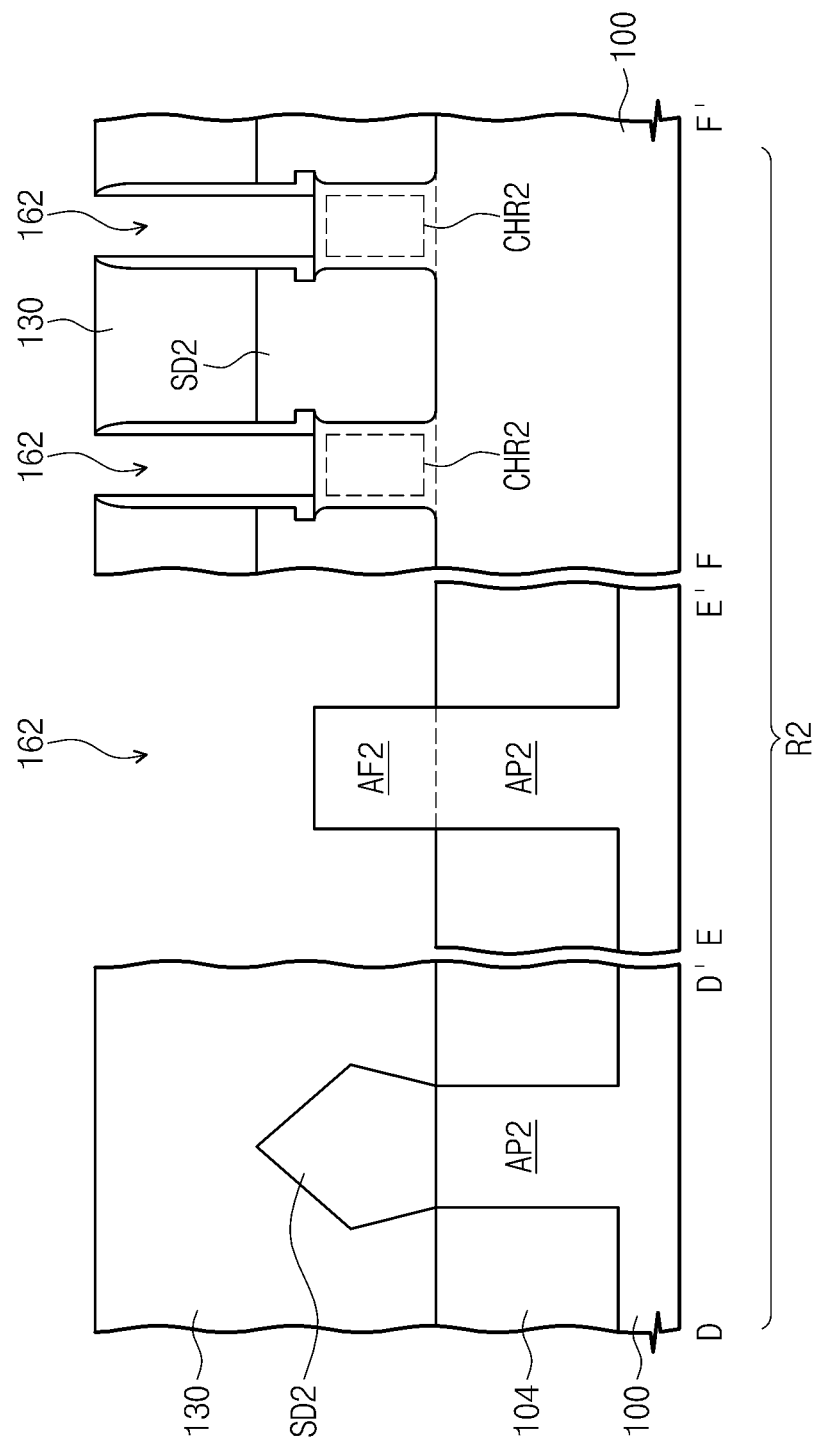

Referring to FIGS. 9A to 9C, the lower interlayer insulating layer 130 may be formed on the substrate 100 provided with the first and second source/drain regions SD1 and SD2. The lower interlayer insulating layer 130 may be formed to cover the first and second source/drain regions SD1 and SD2 and the first and second sacrificial gate structures SGS1 and SGS2. The lower interlayer insulating layer 130 may be formed of or include at least one of a silicon oxide layer, a silicon nitride layer, a silicon oxynitride layer, and a low-k dielectric layer.

The lower interlayer insulating layer 130 may be etched to expose the top surface of each of the first and second sacrificial gate patterns 107a and 107b. The etching process on the lower interlayer insulating layer 130 may be performed to remove the first and second gate mask patterns 109a and 109b. Subsequently, the first and second sacrificial gate patterns 107a and 107b may be removed. Accordingly, a first gap 160 may be formed between the first gate spacers 120 to expose the first channel region CHR1 of the first active fin AF1, and a second gap 162 may be formed between the second gate spacers 122 to expose the second channel region CHR2 of the second active fin AF2. The forming of the first and second gaps 160 and 162 may include performing an etching process having an etch selectivity with respect to the first and second gate spacers 120 and 122, the lower interlayer insulating layer 130, and the first and second etch stop patterns 105a and 105b to etch the first and second sacrificial gate patterns 107a and 107b. In addition, the forming of the first gap 160 may include removing the first etch stop pattern 105a to expose the first channel region CHR1 of the first active fin AF1, and the forming of the second gap 162 may include removing the second etch stop pattern 105b to expose the second channel region CHR2 of the second active fin AF2.

Referring back to FIGS. 1A to 1C, the first gate dielectric pattern 140 and the first gate electrode 150 may be formed to fill the first gap 160. Also, the second gate dielectric pattern 142 and the second gate electrode 152 may be formed to fill the second gap 162.

In some examples, a gate dielectric layer (not shown) may be formed on the substrate 100 to partially fill each of the first and second gaps 160 and 162. The gate dielectric layer may be formed to cover the first and second channel regions CHR1 and CHR2. The gate dielectric layer may include at least one high-k dielectric layer. For example, the gate dielectric layer may be formed of or include at least one of hafnium oxide, hafnium silicate, zirconium oxide, and zirconium silicate, but the inventive concept may not be limited thereto. In addition, the gate dielectric layer may be formed by, for example, an atomic layer deposition process. A gate layer (not shown) may be formed on the gate dielectric layer to fill the remaining space of each of the first and second gaps 160 and 162. The gate layer may be formed of or include at least one material selected from the group consisting of conductive metal nitrides (e.g., titanium nitride or tantalum nitride) and metals (e.g., aluminum or tungsten).

A planarization process may be performed on the gate dielectric layer and the gate layer, which are sequentially stacked on the substrate 100, and thus, the first gate dielectric pattern 140, the second gate dielectric pattern 142, the first gate electrode 150, and the second gate electrode 152 may be formed. For example, the planarization process may be performed to expose the top surface of the lower interlayer insulating layer 130 and the top surface of each of the first and second gate spacers 120 and 122. Each of the first and second gate dielectric patterns 140 and 142 may extend along the bottom surface of each of the first and second gate electrode 150 and 152. The first gate dielectric pattern 140 may be formed on both side surfaces of the first gate electrode 150 and may be interposed between the first gate electrode 150 and the first gate spacer 120. The second gate dielectric pattern 142 may be formed on both side surfaces of the second gate electrode 152 and may be interposed between the second gate electrode 152 and the second gate spacer 122.

The first channel region CHR1 of the first active fin AF1 disposed below the first gate electrode 150 may be interposed between the first source/drain regions SD1, and the second channel region CHR2 of the second active fin AF2 disposed below the second gate electrode 152 may be interposed between the second source/drain regions SD2. The first gate dielectric pattern 140, the first gate electrode 150, and the first gate spacer 120 may constitute the first gate structure GS1, and the second gate dielectric pattern 142, the second gate electrode 152, and the second gate spacer 122 may constitute the second gate structure GS2

Although not shown, the upper interlayer insulating layer may be formed on the substrate 100 provided with the first and second gate structures GS1 and GS2. The first contact hole and the second contact hole may be formed to penetrate the upper interlayer insulating layer and the lower interlayer insulating layer 130 and thereby to expose the first and second source/drain regions SD1 and SD2, respectively, and the contact plugs may be formed to fill the first and second contact holes. The interconnection lines may be provided on the upper interlayer insulating layer and may be connected to at least one of the contact plugs. The interconnection lines may be connected to the first and second source/drain regions SD1 and SD2 through the contact plugs.

Figure 10A:
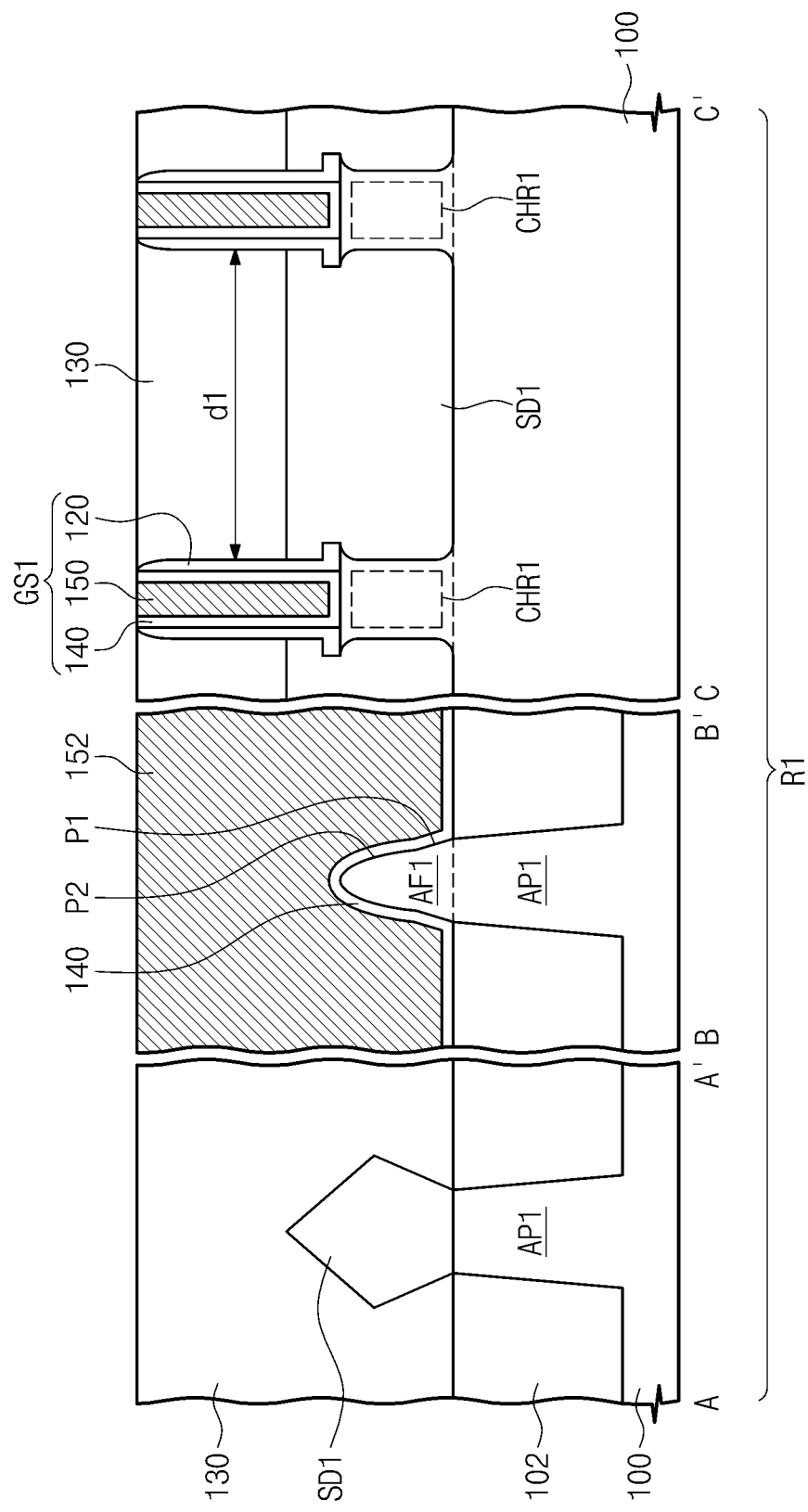
FIGS. 10A and 10B are sectional views illustrating a semiconductor device according to some examples of the inventive concept.
Figure 10B:
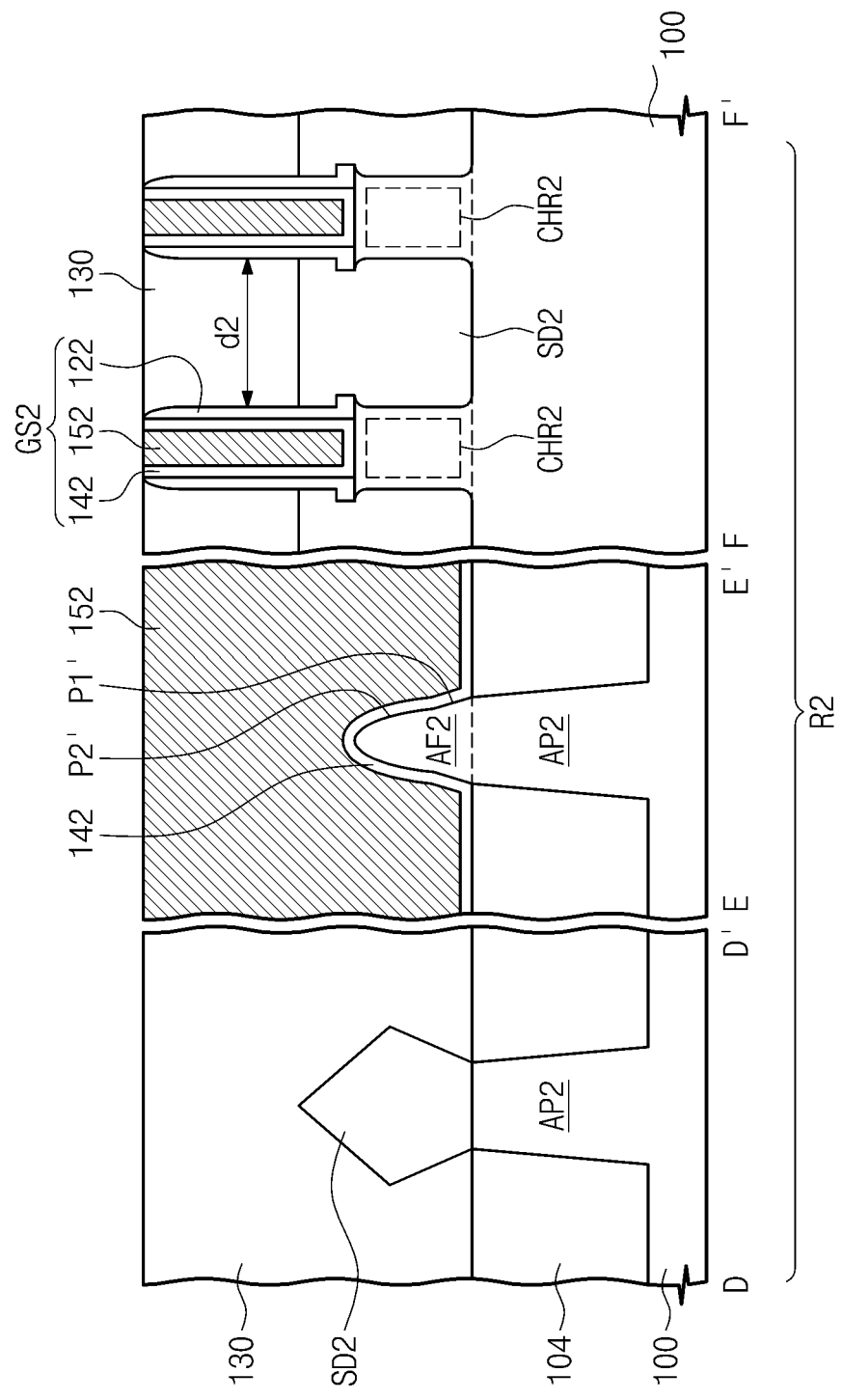

FIGS. 10A and 10B are sectional views illustrating a semiconductor device according to some examples of the inventive concept. For example, FIG. 10A illustrates vertical sections taken along lines A-A', B-B', and C-C' of FIG. 1A, and FIG. 10B illustrate vertical sections taken along lines D-D', E-E', and F-F' of FIG. 1A. In the following description, an element previously described with reference to FIGS. 1A to 1C, 2A, and 2B may be identified by a similar or identical reference number without repeating an overlapping description thereof, for the sake of brevity.

Referring to FIGS. 10A and 10B, each of the first and second active patterns AP1 and AP2 may be provided to have a structure upwardly protruding from the substrate 100. For example, each of the first and second active patterns AP1 and AP2 may protrude in the third direction D3 that is orthogonal to both of the first and second directions D1 and D2. Here, each of the first and second active patterns AP1 and AP2 may have a width decreasing in a direction (the third direction D3) away from the substrate 100.

Each of the first device isolation patterns 102 may cover a portion of the side surface of the first active pattern AP1, and the upper portion of the first active pattern AP1 exposed by the first device isolation patterns 102 may be used as the first active fin AF1. Here, the first active fin AF1 may include a first portion P1 and a second portion P2. The first portion P1 of the first active fin AF1 may have side surface inclined inwardly in a direction away from the first active pattern AP1. The second portion P2 of the first active fin AF1 may be a protrusion extending upwardly from a top of the first portion P1 and having a side surface inclined inwardly also in a direction away from the first active pattern AP1 but to a different degree than the side surface of first portion P1. That is, in some examples, the first active fin AF1 may be provided in such a way that the side surfaces of the first and second portions P1 and P2 have slopes different from each other. In the illustrated example, the slope of the side of the first portion P1 is greater than that of the side surface of the second portion P2. Features such as the widths, heights, and slopes of the side surfaces of the first and second portions P1 and P2 of the first active fin AF1 may be established to specifications by implementing process conditions selected to produce the desired features.

Similarly, each of the second device isolation patterns 104 may cover a portion of the side surface of the second active pattern AP2 and the upper portion of the second active pattern AP2 exposed by the second device isolation patterns 104 may be used as the second active fin AF2. Here, the second active fin AF2 may include a first portion P1' and a second portion PT. The first portion P1' of the second active fin AF2 may have a side surface inclined inwardly in a direction away from the second active pattern AP2. The second portion P2' of the second active fin AF2 may be a protrusion upwardly extending from a top of the first portion P1' of the second active fin AF2 and having a side surface inclined inwardly in the direction away from the second active pattern AP2. In some examples, the second active fin AF2 may be provided in such a way that the side surfaces of the first and second portions P1' and P2' have slopes different from each other. Widths, heights, and angles of the first and second portions P1' and P2' of the second active fin AF2 may be designed to specifications by implementing appropriate process conditions.

According to some examples of the inventive concept, the first gate structures GS1 may be formed on the first region R1 at a relatively large pitch or spacing (e.g., the first distance d1), and the second gate structures GS2 may be formed on the second region R2 at a relatively small pitch or spacing (e.g., the second distance d2). The coating layer 170 may be formed to different thicknesses (e.g., w1 and w2) on the first and second regions R1 and R2, and then, a recess process may be performed on the structure provided with the coating layer 170. This may make it possible to control depths of recesses that are formed by the recess process. For example, it is possible to prevent a loading effect and consequently to mitigate several technical problems (e.g., differences in epitaxial growth rate, reduction in process margin of a contact forming process, or increase in resistance) which would otherwise be created in a subsequent process due to the loading effect. In addition, it is possible to control an amount of a recessed material. Since a hard mask pattern is protected by the coating layer 170, it is possible to improve mask selectivity. The coating layer 170 may prevent the first and second spacer structures SP1 and SP2 from being etched or removed. The processes of depositing and etching the coating layer may be easily performed in an in-situ manner.

So far, the first and second gate structures 150 and 152 have been described as an example of spaced apart features to which the inventive concept is applied, but the inventive concept is not limited thereto. That is, the inventive concept may be applied to methods in which other features formed a substrate such as series of openings having different aspect ratios or series of protrusions having a difference in terms of their width and height. Also, each of the first and second gate spacers has been described as a single-layer structure, but the first and second gate spacers may be multi-layered structures. The distance between the gate structures on the first region has been described to be greater than that on the second region. Here, the first region may include an input/output semiconductor device, and the second region may include a logic device. Furthermore, to reduce complexity in the drawings, the first and second gate structures have been illustrated to have the same width and the same height, but the first and second gate structures may have different widths and heights.

Finally, although examples of the inventive concepts have been particularly shown and described, it will be understood by one of ordinary skill in the art that variations in form and detail may be made to these examples without departing from the spirit and scope of the attached claims.

What is claimed is:

1. A semiconductor device, comprising:
   a substrate with a first region and a second region;
   a first active pattern on the first region of the substrate;
   a second active pattern on the second region of the substrate;
   first gate structures each crossing the first active pattern and spaced apart from each other by a first distance along the first active pattern;
   second gate structures each crossing the second active pattern and spaced apart from each other by a second distance, less than the first distance, along the second active pattern;
   a first source/drain region on the first active pattern between the first gate structures; and
   a second source/drain region on the second active pattern between the second gate structures,
   wherein each of the first gate structures comprises a first gate pattern and a first gate spacer on an outer side surface of the first gate pattern, the first gate spacer comprising a first protrusion protruding from a lower portion of the first gate spacer by a first length in a direction parallel to the first active pattern,
   each of the second gate structures comprises a second gate pattern and a second gate spacer on an outer side surface of the second gate pattern, the second gate spacer comprising a second protrusion protruding from a lower portion of the second gate spacer by a second length in a direction parallel to the second active pattern, and
   the first length is longer than the second length.

2. The device of claim 1, wherein the first length is longer by about 5 Å to about 2 nm than the second length.

3. The device of claim 1, wherein the first region comprises a logic semiconductor device, and the second region comprises an input/output semiconductor device.

4. The device of claim 1, wherein the first and second active patterns extend in a first direction,
   the first and second gate patterns extend in a second direction crossing the first direction, and
   the first and second protrusions extend in the first direction.

5. The device of claim 4, further comprising:
a first active fin between the first active pattern and the first gate pattern; and
a second active fin between the second active pattern and the second gate pattern,
wherein the first and second active patterns below the first and second gate patterns have first and second widths parallel to the second direction, respectively, and the first and second widths decrease in a direction away from the substrate.

6. The device of claim 4, further comprising:
a first active fin between the first active pattern and the first gate pattern; and
a second active fin between the second active pattern and the second gate pattern,
wherein the first and second active patterns below the first and second gate patterns have widths greater than widths of the first and second gate patterns in the first direction.

7. The device of claim 1, wherein the first protrusion has an upwardly facing top surface and a side surface facing in the direction parallel to the first active pattern,
the second protrusion has an upwardly facing top surface and a side surface facing in the direction parallel to the second active pattern,
the first source/drain region is in contact with the top surface and the side surface of the first protrusion, and
the second source/drain region is in contact with the top surface and the side surface of the second protrusion.

8. A semiconductor device, comprising:
a substrate with a first region and a second region;
a first active pattern on the first region of the substrate;
a second active pattern provided on the second region of the substrate;
first gate structures each crossing the first active pattern and spaced apart from each other by a first distance along the first active pattern;
second gate structures each crossing the first active pattern and spaced apart from each other by a second distance along the second active pattern;
a first source/drain region on the first active pattern between the first gate structures; and
a second source/drain region on the second active pattern between the second gate structures,
wherein each of the first gate structures comprises a first gate pattern and a first gate spacer on an outer side surface of the first gate pattern, the first gate spacer comprising a first protrusion protruding from a lower portion of the first gate spacer by a first length in a direction parallel to the first active pattern, the first protrusion having a side surface facing in the direction parallel to the first active pattern and an upwardly facing top surface,
each of the second gate structures comprises a second gate pattern and a second gate spacer on an outer side surface of the second gate pattern, the second gate spacer comprising a second protrusion protruding from a lower portion of the second gate spacer by a second length in a direction parallel to the second active pattern, the second protrusion having a side surface facing in the direction parallel to the second active pattern and an upwardly facing top surface, and
wherein the first source/drain region covers the top surface of the first protrusion and is disposed against the side surface of the first protrusion so as to be in contact with the side surface and the top surface of the first protrusion, and
the second source/drain region covers the top surface of the second protrusion and is disposed against the side surface of the second protrusion so as to be in contact with the side surface and the top surface of the second protrusion.

9. The device of claim 8, wherein the first distance is greater than the second distance and the first length is longer than the second length.

10. The device of claim 9, wherein the first length is longer by about 5 Å to about 2 nm than the second length.

11. The device of claim 8, wherein the first and second active patterns extend in a first direction,
the first and second gate patterns extend in a second direction crossing the first direction, and
the first and second protrusions extend in the first direction.

12. The device of claim 11, further comprising:
a first active fin between the first active pattern and the first gate pattern; and
a second active fin between the second active pattern and the second gate pattern,
wherein the first and second active patterns below the first and second gate patterns have first and second widths parallel to the second direction, respectively, and the first and second widths decrease in a direction away from the substrate.

13. The device of claim 11, further comprising:
a first active fin between the first active pattern and the first gate pattern; and
a second active fin between the second active pattern and the second gate pattern,
wherein the first and second active patterns below the first and second gate patterns have widths greater than widths of the first and second gate patterns in the first direction.

14. The device of claim 8, wherein the first region comprises a logic semiconductor device, and the second region comprises an input/output semiconductor device.

15. A semiconductor device, comprising:
a substrate with a first region and a second region;
a first active pattern on the first region of the substrate;
a second active pattern provided on the second region of the substrate;
first gate structures each crossing the first active pattern and spaced apart from each other by a first distance along the first active pattern;
second gate structures each crossing the first active pattern and spaced apart from each other by a second distance, less than the first distance, along the second active pattern;
a first source/drain region on the first active pattern between the first gate structures such that a bottom of the first source/drain region and a top of the first active region meet; and
a second source/drain region on the second active pattern between the second gate structures such that a bottom of the second source/drain region and a top of the second active region meet,
wherein each of the first gate structures comprises a first gate pattern and a first gate spacer on an outer side surface of the first gate pattern, the first gate spacer comprising a first protrusion protruding from a lower portion of the first gate spacer in a direction parallel to the first active pattern,
each of the second gate structures comprises a second gate pattern and a second gate spacer on an outer side surface of the second gate pattern, the second gate spacer comprising a second protrusion protruding from a lower portion of the second gate spacer in a direction parallel to the second active pattern, and wherein the first protrusion protrudes from the lower portion of the first gate spacer by a first length in the direction parallel to the first active pattern, the second protrusion protrudes from the lower portion of the second gate spacer by a second length in the direction parallel to the second active pattern, and the first length is longer than the second length.

16. The device of claim 15, further comprising a first active fin between the first active pattern and the first gate pattern, and a second active fin between the second active pattern and the second gate pattern, and wherein each the first active fin and the second active fin has a width decreasing in a direction away from the substrate.

17. The device of claim 15, further comprising a first active fin between the first active pattern and the first gate pattern, and a second active fin between the second active pattern and the second gate pattern, and wherein the first active fin has a width greater than a width of the first gate pattern, and the second active fin has a width greater than a width of the second gate pattern.

18. The device of claim 15, wherein the first protrusion has an upwardly facing top surface and a side surface facing in the direction parallel to the first active pattern, the second protrusion has an upwardly facing top surface and a side surface facing in the direction parallel to the second active pattern, the first source/drain region covers the top surface of the first protrusion and is disposed against the side surface of the first protrusion so as to be in contact with the side surface and the top surface of the first protrusion, and the second source/drain region covers the top surface of the second protrusion and is disposed against the side surface of the second protrusion so as to be in contact with the side surface and the top surface of the second protrusion.

* * * * *